United States Patent
Lizotte

(10) Patent No.: US 6,833,911 B2
(45) Date of Patent: Dec. 21, 2004

(54) METHOD AND APPARATUS FOR READING FIREARM MICROSTAMPING

(75) Inventor: Todd E. Lizotte, Manchester, NH (US)

(73) Assignee: Identification Dynamics, Inc., Pottstown, PA (US)

( * ) Notice: Subject to any disclaimer, the term of this patent is extended or adjusted under 35 U.S.C. 154(b) by 145 days.

(21) Appl. No.: 10/372,459

(22) Filed: Feb. 21, 2003

(65) Prior Publication Data

US 2004/0027630 A1 Feb. 12, 2004

Related U.S. Application Data

(63) Continuation-in-part of application No. 10/232,766, filed on Aug. 29, 2002, which is a continuation-in-part of application No. 10/183,806, filed on Jun. 26, 2002, now Pat. No. 6,653,593, which is a continuation-in-part of application No. 09/540,366, filed on Mar. 31, 2000, now Pat. No. 6,420,675, which is a continuation-in-part of application No. 09/514,084, filed on Feb. 28, 2000, now Pat. No. 6,310,701.

(60) Provisional application No. 60/315,851, filed on Aug. 29, 2001, and provisional application No. 60/158,478, filed on Oct. 8, 1999.

(51) Int. Cl.[7] .............................................. G06K 9/74
(52) U.S. Cl. ................................................... 356/71
(58) Field of Search ................................ 356/71, 237.1, 356/237.2, 445; 250/461.1, 461.2, 458.1; 382/112

(56) References Cited

U.S. PATENT DOCUMENTS

| | | | |
|---|---|---|---|
| 3,800,074 A | * | 3/1974 | Fletcher et al. ............. 348/128 |
| 4,035,942 A | | 7/1977 | Wiczer |
| 4,175,346 A | | 11/1979 | Zemsky ........................ 42/78 |
| 4,326,824 A | | 4/1982 | Lasermann et al. ......... 409/132 |
| 4,348,253 A | | 9/1982 | Subbarao et al. ........... 156/643 |
| 4,473,737 A | | 9/1984 | Anthony ............... 219/121 LL |
| 4,532,402 A | | 7/1985 | Overbeck ............. 219/121 LU |
| 4,681,452 A | | 7/1987 | Watanabe .................... 356/375 |
| 4,844,617 A | * | 7/1989 | Kelderman et al. .......... 356/624 |
| 4,959,119 A | | 9/1990 | Lantzer ....................... 156/644 |
| 5,108,785 A | | 4/1992 | Lincoln et al. ............... 427/96 |
| 5,126,648 A | | 6/1992 | Jacobs ........................ 318/640 |
| 5,157,235 A | | 10/1992 | Okumura et al. ...... 219/121.68 |
| 5,257,091 A | | 10/1993 | Caicedo, Jr. et al. ....... 356/358 |
| 5,293,025 A | | 3/1994 | Wang .................... 219/121.71 |
| 5,379,106 A | * | 1/1995 | Baldur ........................ 356/623 |
| 5,481,407 A | | 1/1996 | Smith ......................... 359/742 |
| 5,502,914 A | | 4/1996 | Moon ....................... 42/69.02 |
| 5,509,553 A | | 4/1996 | Hunter, Jr. et al. ........... 216/13 |
| 5,523,543 A | | 6/1996 | Hunter, Jr. et al. ..... 219/121.62 |
| 5,528,368 A | * | 6/1996 | Lewis et al. ................. 356/456 |
| 5,552,574 A | | 9/1996 | Merlin .................. 219/121.69 |

(List continued on next page.)

FOREIGN PATENT DOCUMENTS

IT 270630 6/1930

OTHER PUBLICATIONS

Vainos, N.A., S. Mallis, S. Plssadakis, L. Boutsikaris, P.J.M. Parmiter, P. Dainty and T.J. Hall, "Excimer laser use for microetching computer–generated holographic structures," Applied Optics, vol. 35, No. 32, Nov. 10, 1996, pp. 6304–6319.

*Primary Examiner*—Michael P. Stafira
(74) *Attorney, Agent, or Firm*—Davis & Bujold, P.L.L.C.

(57) ABSTRACT

Identification of firearms by illuminating a base of a fired cartridge from a firearm using axially homogenized light from various illumination angles using a holographic imaging system integrated into either a mono-chromatic or multi-chromatic light, obtaining a microscope image of an encoded hologram or encoded alphanumeric code or barcodes or indicia that form unique impressions on a primer of the cartridge or bullet; and utilizing specialized analysis software to read the encoded codes and provide the serial number or tracking number unique to the firearm that fired the bullet or cartridge.

7 Claims, 25 Drawing Sheets

U.S. PATENT DOCUMENTS

| | | | |
|---|---|---|---|
| 5,571,429 A | 11/1996 | Smith | 219/121.68 |
| 5,593,606 A | 1/1997 | Owen et al. | 219/121.71 |
| 5,614,114 A | 3/1997 | Owen | 219/121.66 |
| 5,633,735 A | 5/1997 | Hunter, Jr. et al. | 359/15 |
| 5,685,100 A | 11/1997 | Atchison | 42/1.01 |
| 5,702,662 A | 12/1997 | Smith et al. | 264/400 |
| 5,737,122 A | 4/1998 | Wilt et al. | 359/436 |
| 5,758,446 A | 6/1998 | Atchison | 42/78 |
| 5,808,272 A | 9/1998 | Sun et al. | 219/121.68 |
| 5,811,754 A | 9/1998 | Nakatani et al. | 219/121.83 |
| 5,841,099 A | 11/1998 | Owen et al. | 219/121.69 |
| 5,847,960 A | 12/1998 | Cutler et al. | 364/474.29 |
| 5,894,530 A | 4/1999 | Wilt | 382/312 |
| 5,920,973 A | 7/1999 | Kosmowski | 29/26 A |
| 5,984,079 A | 11/1999 | Garcia | 198/397.02 |
| 5,990,444 A | 11/1999 | Costin | 219/121.69 |
| 5,997,223 A | 12/1999 | Kosmowski | 408/124 |
| 6,022,905 A | 2/2000 | Harris et al. | 522/2 |
| 6,025,601 A * | 2/2000 | Trulson et al. | 250/461.2 |
| 6,086,204 A | 7/2000 | Magnante | 351/212 |
| 6,462,302 B1 | 10/2002 | Grow | 219/121.68 |

* cited by examiner

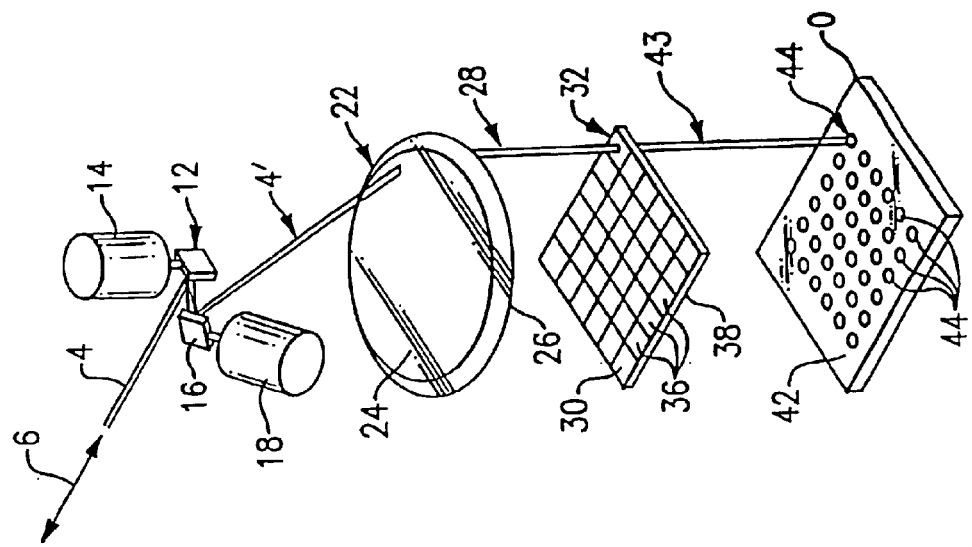
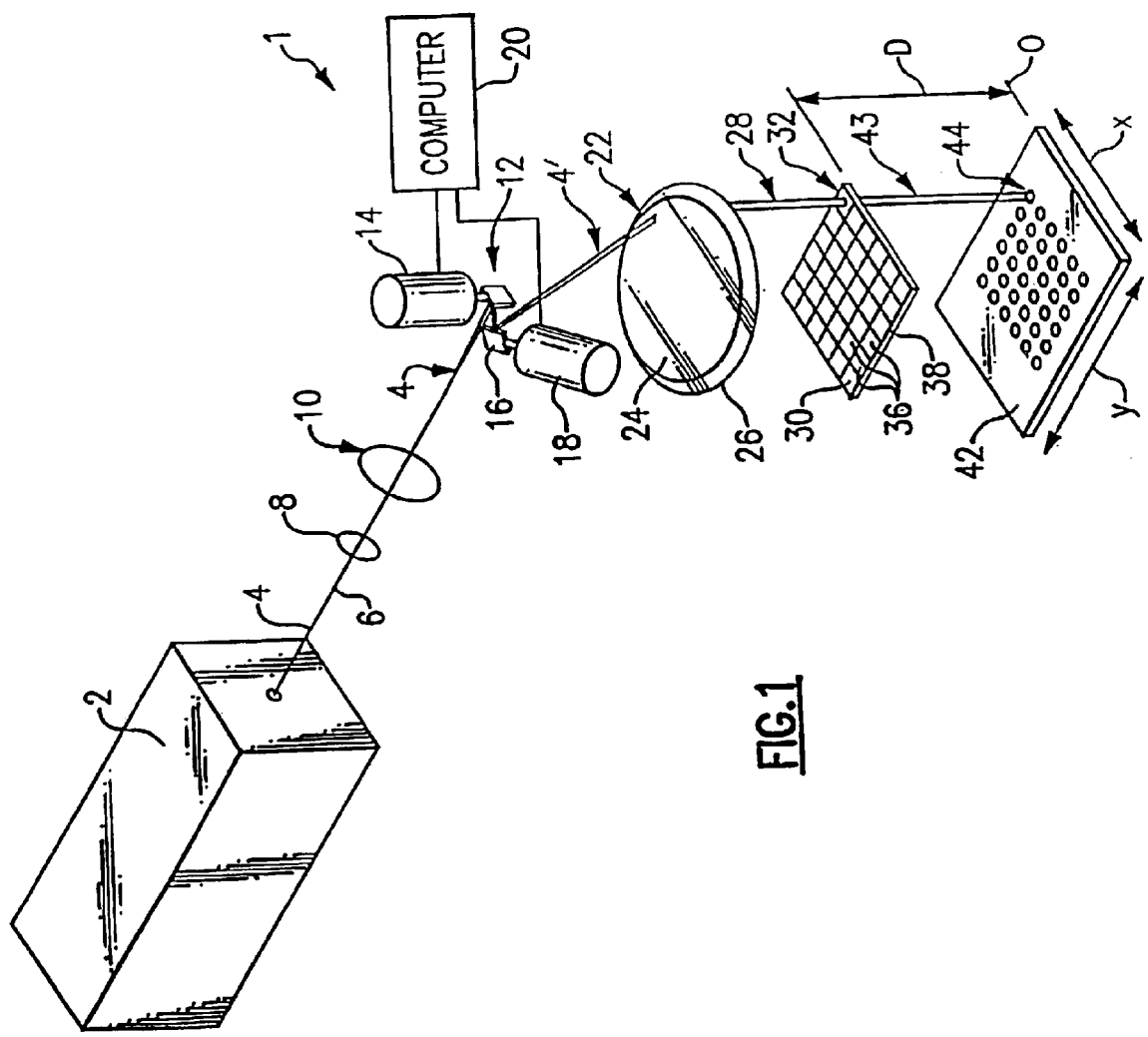
FIG.2
FIG.1

Gaussian

Psuedo Flat Top

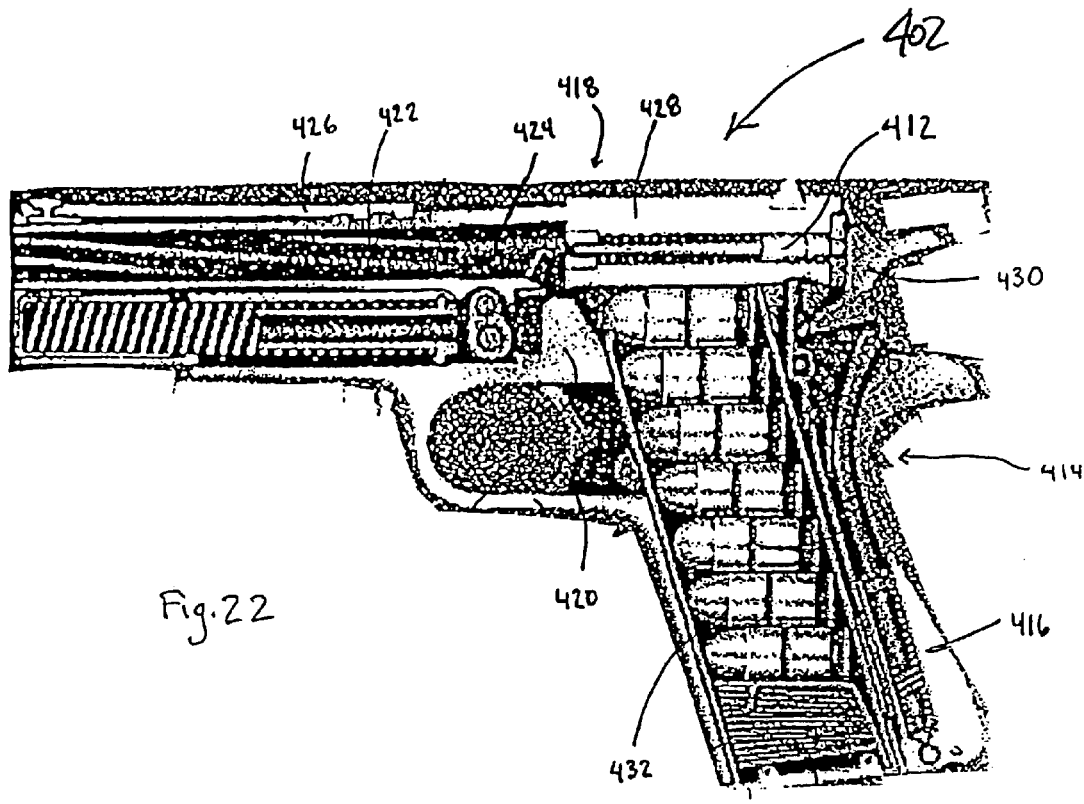
Fig. 22
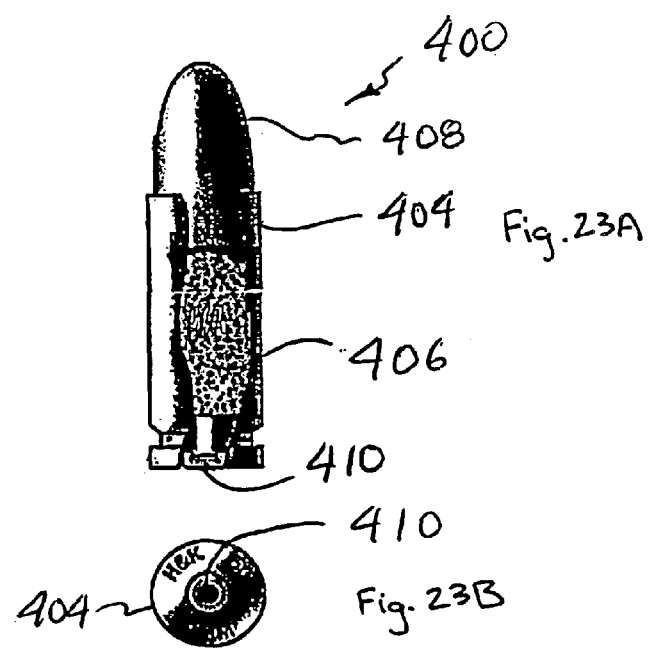
Fig. 23A
Fig. 23B

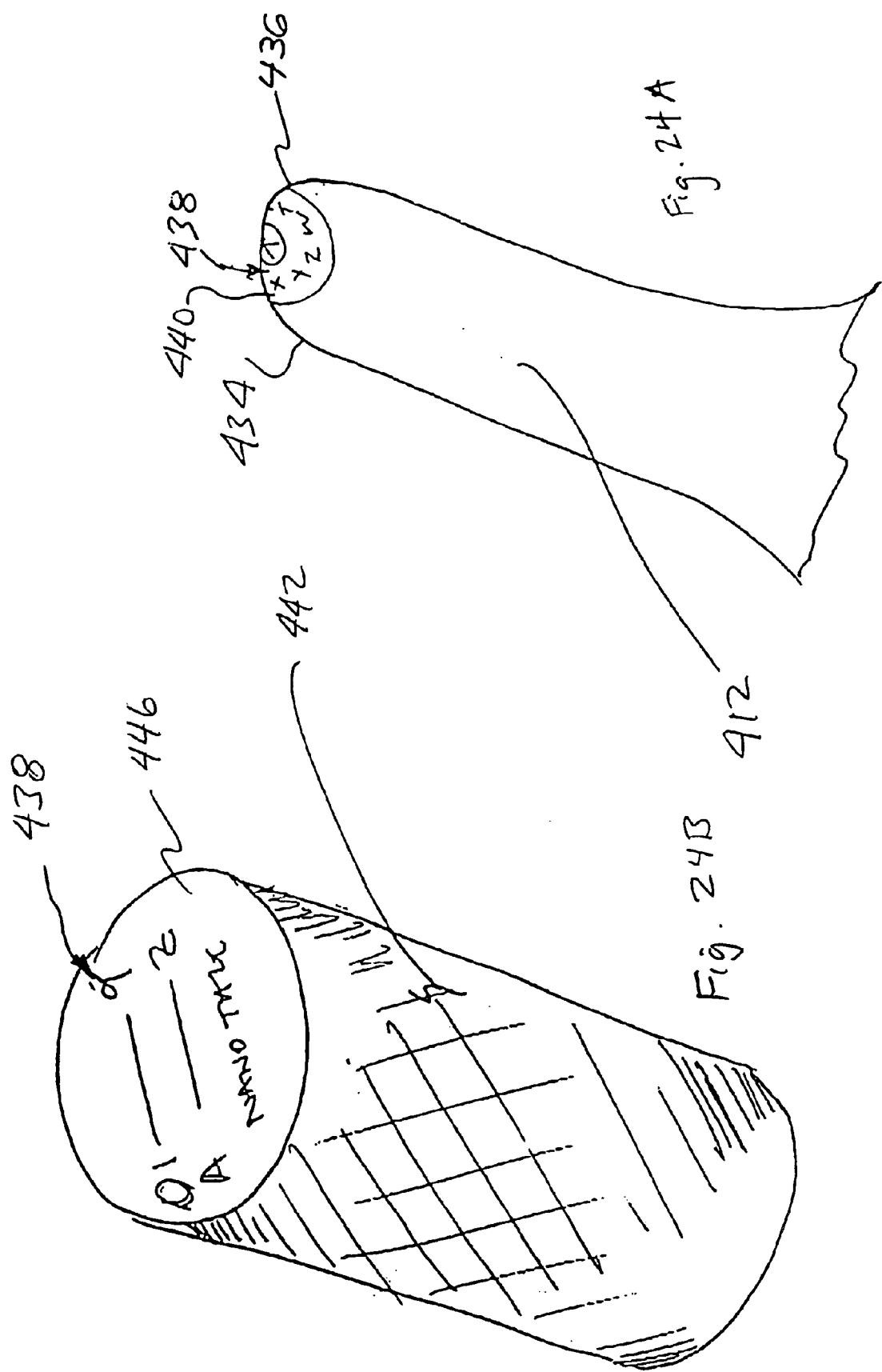

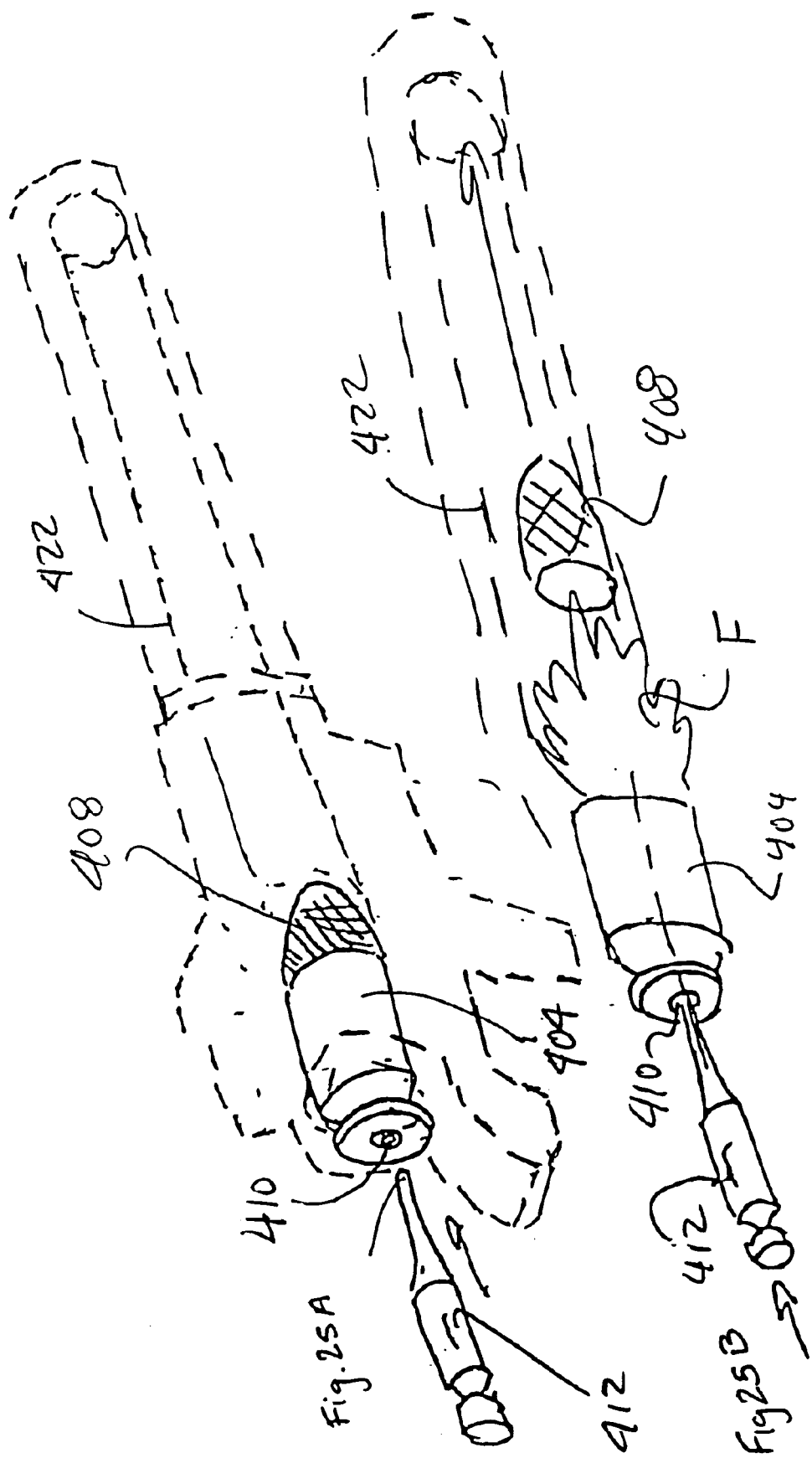

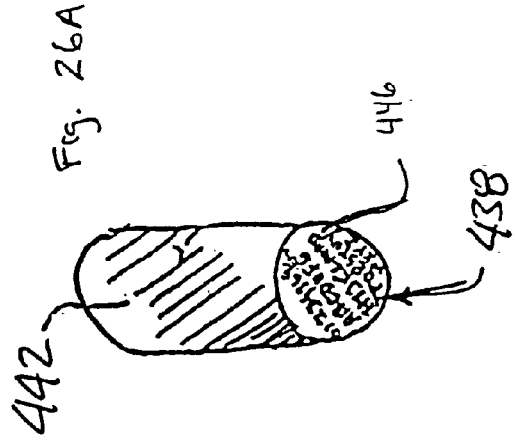
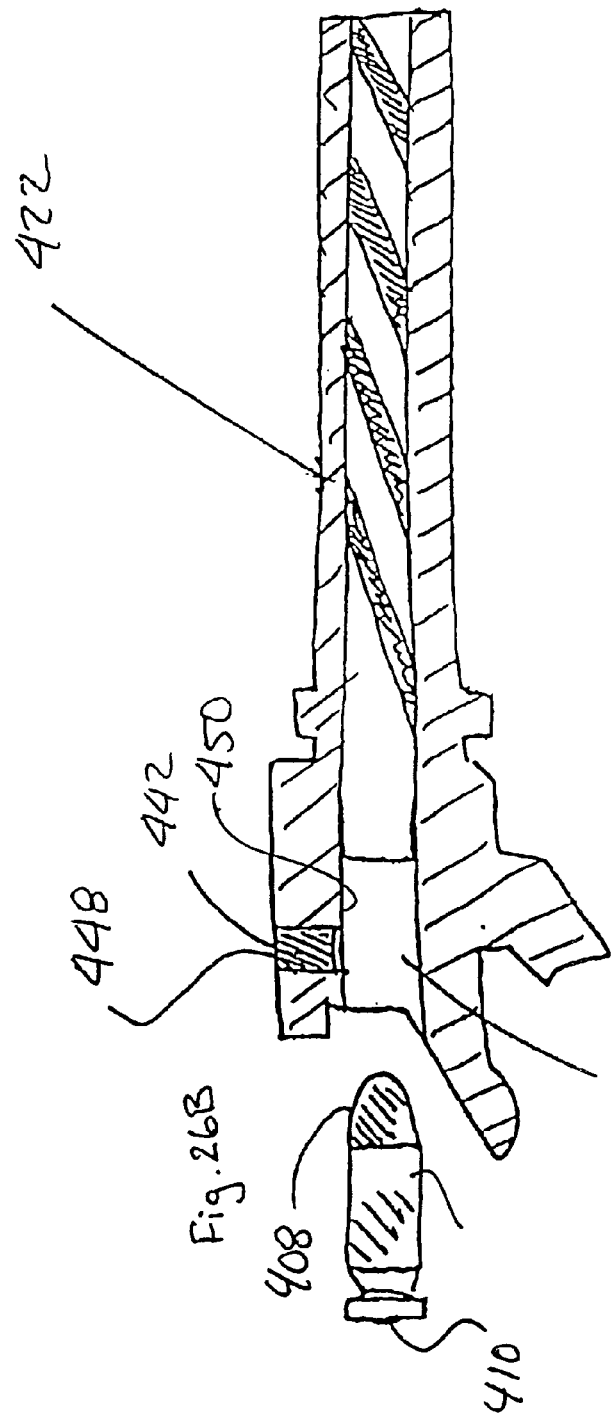

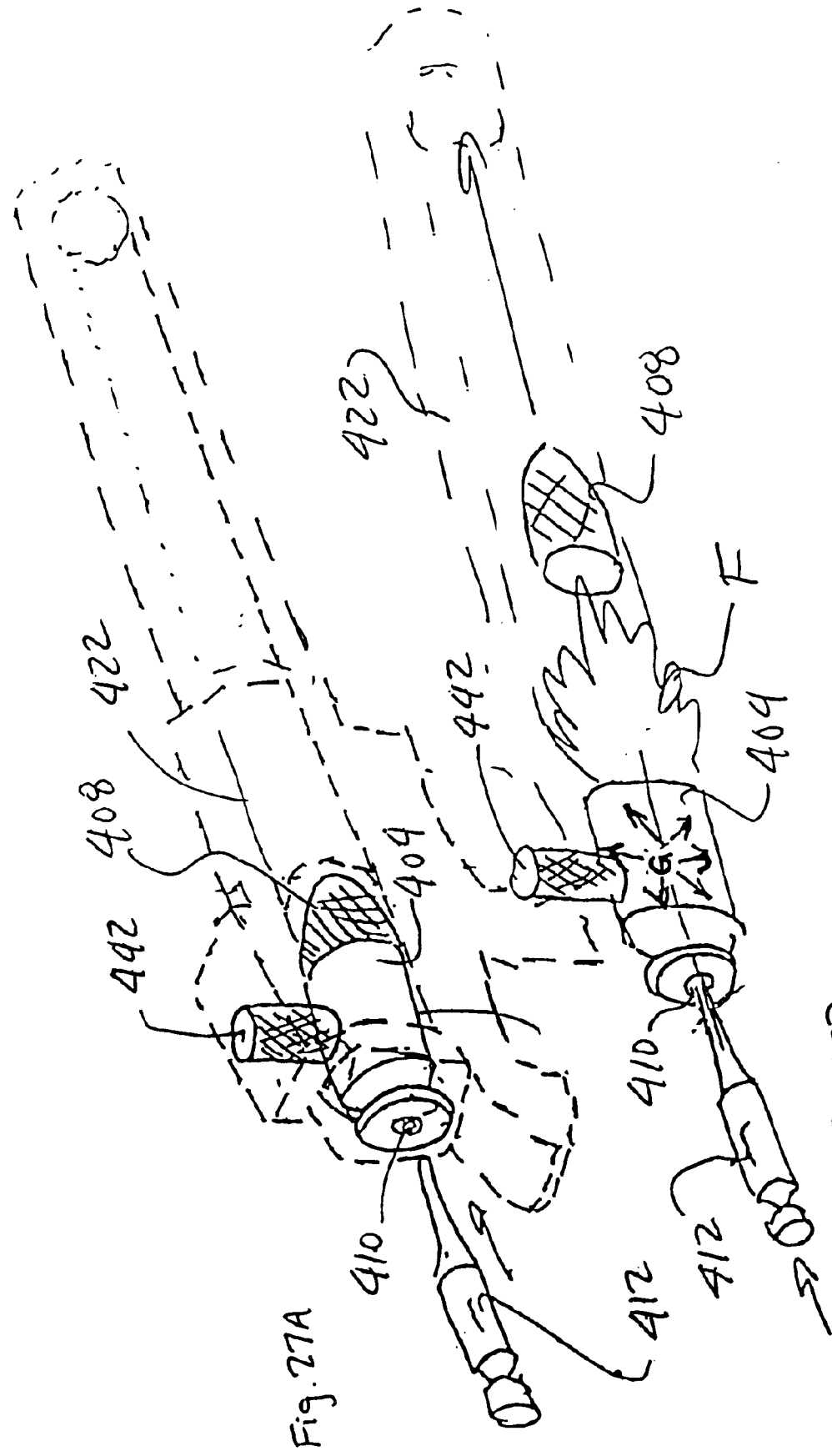

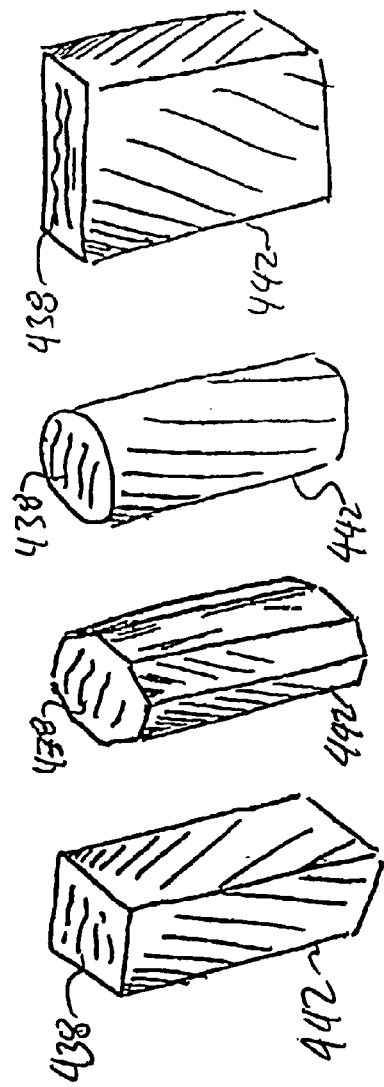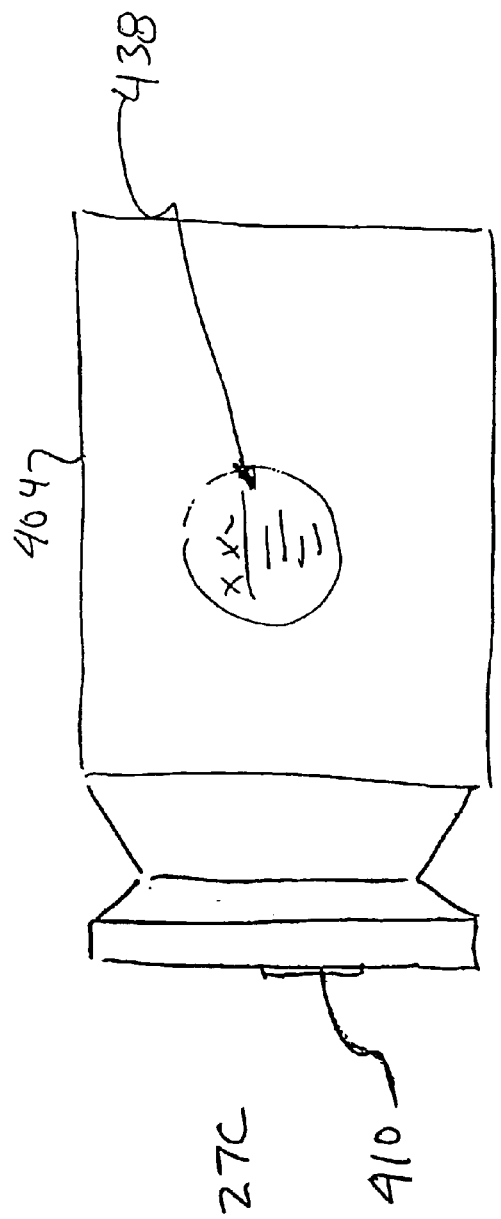

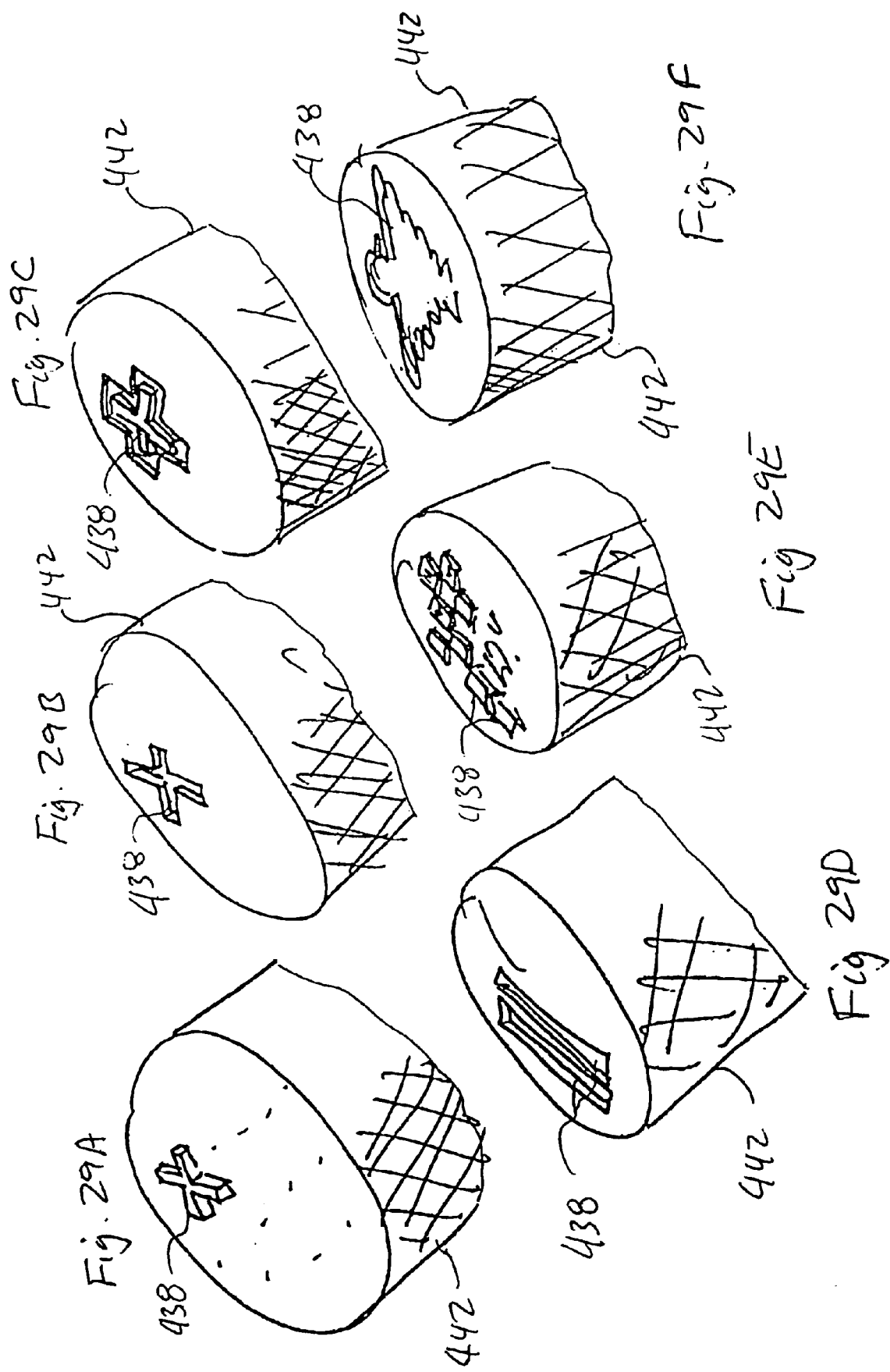

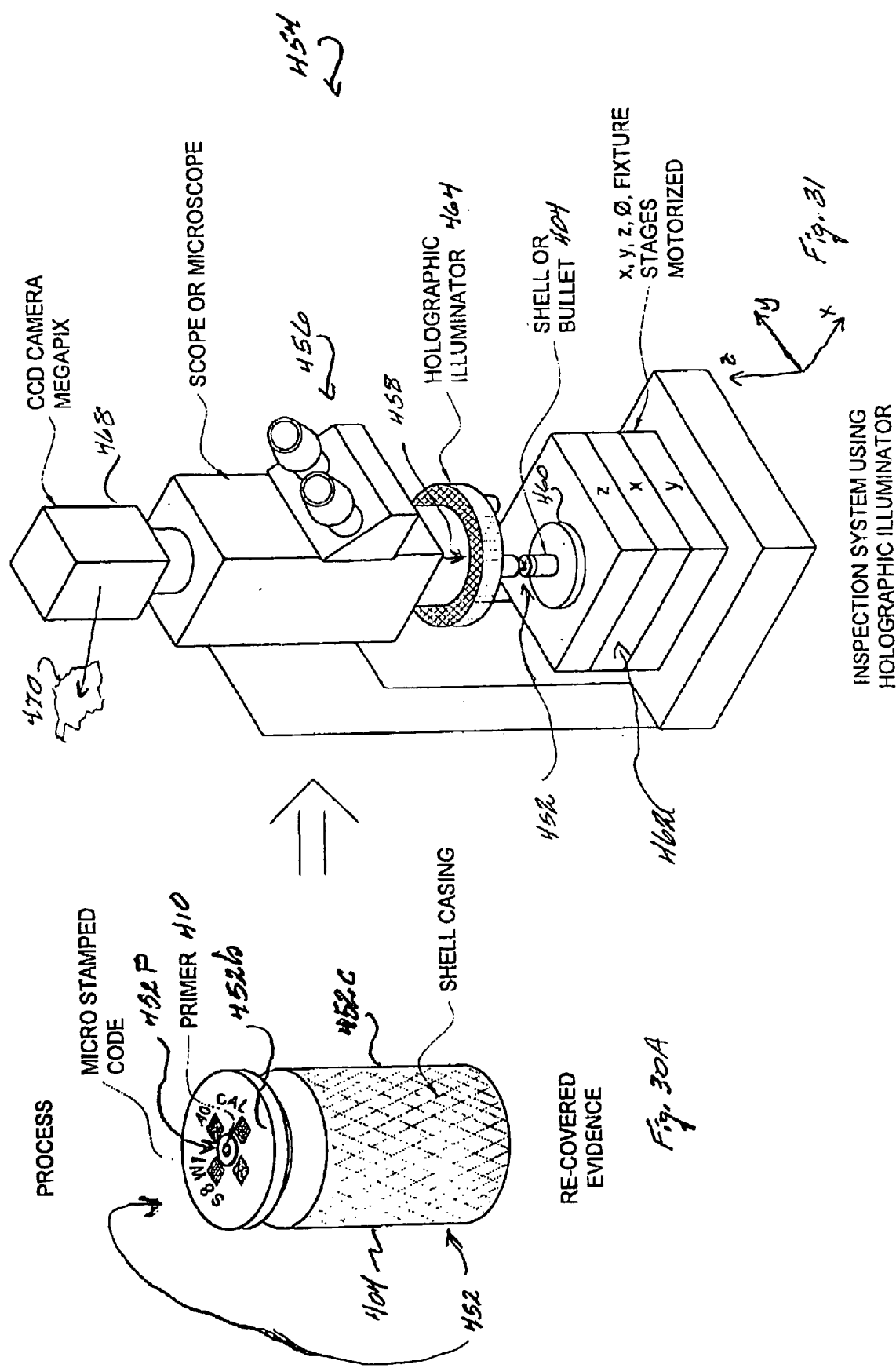

METHOD AND APPARATUS FOR READING FIREARM MICROSTAMPING

This application is a continuation-in-part of and claims benefit of U.S. patent application Ser. No. 10/232,766 filed Aug. 29, 2002, which in turn claims benefit of provisional Patent Application Ser. No. 60/315,851 filed Aug. 29, 2001, which is a continuation-in-part of and claims benefit of patent application Ser. No. 10/183,806 filed Jun. 26, 2002 now U.S. Pat No. 6,653,593, which is a continuation-in-part of and claimed benefit of patent application Ser. No. 09/540,366 filed Mar. 31, 2000, now U.S. Pat. No. 6,420,675 B1, which is a continuation-in-part of and claimed benefit of patent application Ser. No. 09/514,084 filed Feb. 28, 2000, now U.S. Pat. No. 6,310,701 B1, which claimed benefit of provisional Ser. No. 60/158,478 filed Oct. 8, 1999.

FIELD OF THE INVENTION

The present invention relates to a fired cartridge and bullet examination imaging apparatus for use during forensic analysis of spent firearm cartridges. The invention relates further to a method of capturing encoded geometric shapes or alpha numeric character images which are embossed or tool marked onto the cartridge surfaces by the specific firearm that expended the cartridge.

BACKGROUND OF THE INVENTION

Mechanical forensics and ballistics investigations are undertaken in most crime investigations, accident reconstruction or other situations in which one or more weapons was discharged during the commission of the crime, by accident or perhaps for justifiable cause. Reconstruction, investigation and prosecution, of all incidents of firearm use can be made easier when it is possible to show that a particular weapon was used or discharged during the specific incident being investigated or reconstructed.

It is well known, however, that bullets and cartridge cases that have been fired from a firearm will bear markings from contact between the bullets or cartridge cases and the surfaces of the firearm with which the bullets and cartridges come into contact. For example, the rifling of the barrel will emboss rifling and other marks on a bullet, and the firing pin, extractor, interior of the breach and face of the bolt will leave markings on the cartridge case. Certain such markings are general to a given type of firearm, and may this aid in identifying a type of firearm, while others are unique to each firearm and may thereby be used to identify a given firearm.

The markings most useful for identifying a given, specific firearm, however, are pseudo repeatable and random and take the form of "scratches and dings" termed "Ballistic Finger Prints" which are non-specific in nature. Firearms experts, however, by microscopic examination of fired bullets and cartridges (casings or shells), firearms have traditionally been able to compare markings to identify whether fired bullets or spent cartridges originate from a given firearm. There exist, for example, databases of "Ballistic Finger Prints" or "Scratch and Ding" Images of bullets and cartridges recovered from crime scenes, for example, which may be subsequently used to match a firearm to a given crime scene by matching samples of fired cartridges and bullets with the archived "Ballistic Finger Prints" or "Scratch and Ding" images.

Unfortunately, investigators often have limited evidence to work with in order to determine the facts related to the situation at hand, for example, when the used firearm is unavailable, missing, unrecoverable or numerous weapons were discharged. For example, it is very common for the perpetrator of a shooting to take the firearm away with him after committing a crime, and often the only evidence left behind is the discharged bullets themselves, if they can be found, and the spent shell casings. While scratches, marks and/or other indicia on a spent bullet or shell casing can assist an investigator with connecting the spent shell casing or bullet with a given firearm, the identification usually requires possession of the firearm itself, for comparison purposes, is often difficult even when the firearm is available.

Currently, such forensic investigations are expensive and time consuming and require personal training and sophisticated equipment that not every law enforcement department has or can afford.

A concept referred to as "Ballistic Tagging", however, may be used to mark cartridges or bullets or both with specially encoded geometric shapes, holograms, alphanumeric codes, barcodes and other specific coding techniques which are not random and are which are completely repeatable and which are unique to each firearm. Such methods would in addition be more reliable and less expensive and time consuming by not requiring the costly apparatus, imperfect imaging algorithms, non-uniform lighting, non-standardized procedures and cross jurisdictional data bases used to store "Ballistic Finger Prints" or "Scratch and Ding" Images.

There are currently available a variety of systems for forming or micro-engraving images, shapes or symbols in or on an exterior surface of an object, such as a firing pin or the interior of the chamber or barrel of a firearm, such that, an image, shape of symbol is embossed or otherwise marked on a surface of a cartridge by the normal operation of the firearm, such as firing of a cartridge or the loading or ejection of a cartridge. Such images, shapes or symbols, hereafter referred to generally as "images, may take any graphic form, including abstract symbols or brands, letters or numbers, and so on, and are typically formed of raised areas of a surface or of surface indentations, such as holes, vias, blind vias or some other form of surface indentation, or any combination thereof.

As a result, fired bullets or cartridge cases or both may be left with markings from the firearm from which they come. These markings result from forced contact with metal parts in the firearm bearing such images, such as an interior face of the chamber, bolt or barrel or an engraved "marker" embedded in or mounted on such a surface, and may be unique to given firearm by the engraving of an image unique to the firearm during manufacture or as a result of a subsequent refitting or retro-fitting.

The advantages of such marking of bullets and cartridges can be realized, however, only if there exist methods and apparatus for simply, inexpensively and reliably reading the markings, and for correlating the markings on a bullet or cartridge with a given firearm.

It is therefore an object of the present invention to simplify and therefore to improve the automated process of fired cartridge and bullet imaging and analysis, to eliminate the need for complex image algorithms, to reduce the chances of human error, and to eliminate at least some of the need for mapping "Scratches and Dings" of fired cartridges, termed a "Ballistic Finger Print".

SUMMARY OF THE INVENTION

The present invention is directed to a method and apparatus for identifying and tracing firearms by analysis of the cartridge shell casings and/or projectiles. This technique was developed to assist with both foreign and domestic law enforcement and government gun control programs.

According to the invention there is provided a fired cartridge imaging apparatus comprising a fired cartridge mounting device for holding the cartridge wherein the cartridge is substantially aligned normal to the axis of illumination, and viewing from the microscope based imaging apparatus a primer surface of the cartridge, the primer surface being substantially perpendicular to the axis of illumination. The apparatus includes a cartridge microscope having an optical axis and, mounted with the optical axis substantially parallel to the longitudinal axis, a focusing means for focusing the microscope to image a breech face encoded impression on the primer surface and a encoded firing pin impression surface in the primer surface. An optimized holographic imaging system is integrated into a mono-chromatic and multi-chromatic illuminator to provide illumination from various angles onto the working area of the microscope apparatus that is being viewed and to provide a non-shadowing intensity variable light.

The task of the imaging apparatus is to capture images of organized images, structures, codes and/or encoded alphanumeric codes or holograms which have a specific meaning that is irrefutable, such as a serial number of the firearm or some code that represents a positive identification of a specific firearm.

The method and apparatus of the present invention provide an apparatus which can switch between several magnifications suitable to view the geometric encoded hologram or alphanumeric codes and other indicia on the breech face, primer surface and other surfaces of a cartridge or bullet.

BRIEF DESCRIPTION OF THE DRAWINGS

The invention will now be described, by way of example, with reference to the accompanying drawings in which:

FIG. 1 is a perspective view diagrammatically showing the entire system of the present invention;

FIG. 2 is an enlarged perspective diagrammatic view of FIG. 1 showing the laser imaging system according to the present invention;

FIG. 22 is a diagrammatic cross sectional view of a conventional hand held firearm;

FIG. 23A is a diagrammatic view, shown partially in section, of a conventional round of ammunition for a firearm, while FIG. 23B shows a diagrammatic bottom view of the round of ammunition of FIG. 23A;

FIG. 24A diagrammatically shows a head of a firing pin engraved with a desired unique identifying indicia;

FIG. 24B diagrammatically shows an end surface of an insert engraved with a desired identifying indicia thereof according to the micro-marking of the present invention;

FIG. 25A is a diagrammatic perspective view showing the firing pin spaced from the primer of the round of ammunition while FIG. 25B is a diagrammatic perspective view showing the firing pin striking the primer of the round of ammunition;

FIG. 26A is a diagrammatic perspective view showing an insert carrying a desired unique identifying indicia while FIG. 26B is a diagrammatic perspective view showing details the insert received within a radial bore formed in the barrel;

FIG. 27A is a diagrammatic perspective view showing the firing pin spaced from the primer of the round of ammunition; FIG. 27B is a diagrammatic perspective view showing the firing pin striking the primer of the round of ammunition and the shell casing expanding and engaging the desired unique identifying indicia carried by the insert; and FIG. 27C is a diagrammatic view showing an impression of the unique identifying indicia formed in the shell casing;

FIG. 28A is a diagrammatic perspective view showing a cylindrically shaped insert, FIG. 28B is a diagrammatic perspective view showing a rectangularly shaped insert; FIG. 28C is a diagrammatic perspective view showing a hexagonally shaped insert; and FIG. 28D is a diagrammatic perspective view showing a square shaped insert; and FIGS. 29A, 29B, 29C, 29D, 29E and 29F show diagrammatic views of a surface of the firearm having various unique identifying indicia formed therein;

FIGS. 30A and 30C are illustrations of a shell casing with identifying indicia on an exterior surface thereof;

FIG. 31 is an optical and digitally encoded imaging apparatus of an imaging and image capture apparatus for identifying one of a shell casing and a bullet fired from a firearm;

DESCRIPTION OF THE PREFERRED EMBODIMENTS

Figure 3:
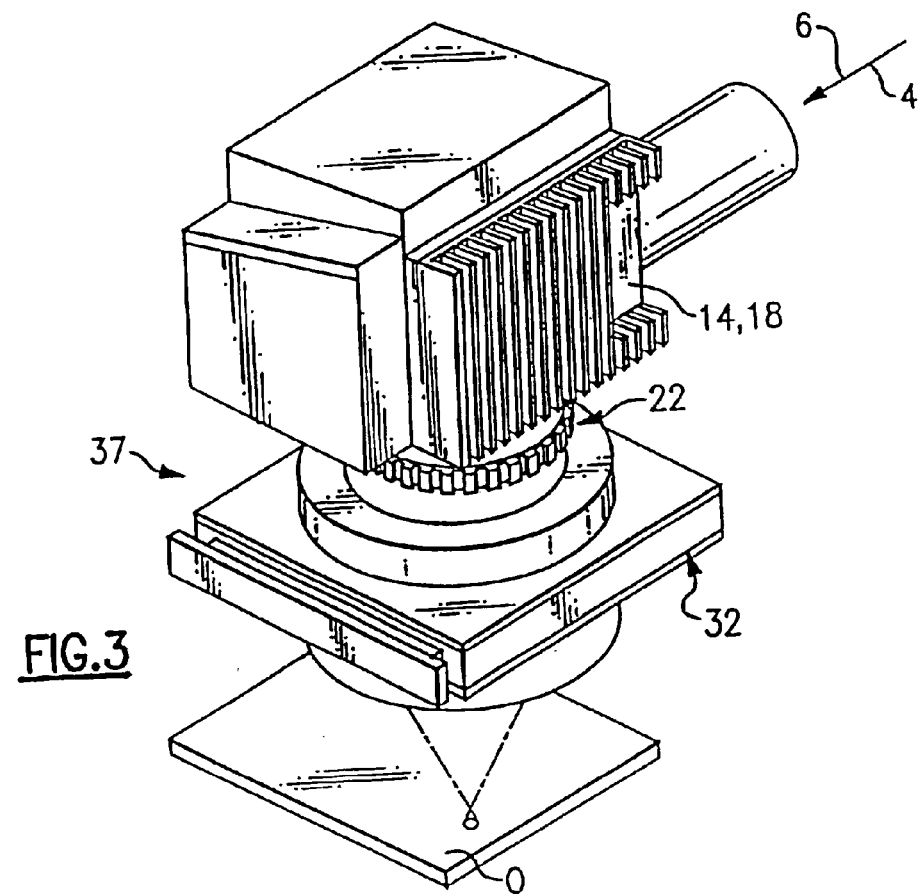
FIG. 3 is a diagrammatic representation showing an X-axis and Y-axis automated repeat positioner, a collimating lens and a holographic lens which are combined as a single unit for use as the laser imaging system of the present invention.

Turning now to FIGS. 1–4, a detailed description of the imaging system 1 apparatus for ablating high-density array of vias or indentations in a surface of an object, according to the present invention, will now be provided. As can be seen in FIG. 1, a conventional laser 2 (only diagrammatically shown in this Figure) is employed for generating and outputting a laser beam 4. It is to be appreciated that the laser 2 can be either excimer or non-excimer laser and further details and operating parameters for the preferred laser, for use with the present invention, will be provided below. The laser beam 4, generated by the laser 2, is either an ultraviolet, a visible, an infrared, a coherent radiation beam or some other light radiation beam 4 which is supplied along a laser axis 6 toward at least a first expansion telescope or expansion lens 8 and also preferably then supplied to a second expansion telescope or expansion lens 10. The purpose of the expansion telescope or lens 8 and/or 10 is/are to suitably expand the diameter of the generated ultraviolet, visible, infrared or other light radiation laser beam 4 so as to have a desired resulting expanded laser diameter for the laser beam 4. As such expansion feature and teaching is conventional and well known in the art, a further detailed discussion concerning the same is not provided.

The expanded ultraviolet, visible, infrared or other light radiation beam 4 then continues, along the laser axis 6, and is directed at and impinges on a first reflective mirror 12 of an X-axis automated repeat positioner 14 of the system 1. The first reflective mirror 12 of the X-axis automated repeat positioner 14 controls the X-coordinate, along the surface 42 of the object to be processed O, at which the ultraviolet, visible, infrared or other light radiation laser beam 4 will be reflected. The first reflective mirror 12 suitably redirects or alters the path of substantially all of the ultraviolet, visible, infrared or other light radiation laser beam 4 and then reflects the laser beam toward a second reflective mirror 16, controlled by a Y-axis automated repeat positioner 18 of the system 1. The second reflective mirror 16, associated with the Y-axis automated repeat positioner 18, controls the Y-coordinate, along the surface 42 of the object to be processed O, at which the ultraviolet, visible, infrared or other light radiation laser beam 4 will be reflected. The expanded ultraviolet, visible, infrared or other light radiation beam 4 impinges on the second reflective mirror 16 and the second reflective mirror 16 suitably redirects or alters the path of the ultraviolet, visible, infrared or other light radiation laser beam 4 toward a rear surface 24 of a flat field collimating lens or some other refractive, detractive or holographic component 22, which is conventional and well known in this art.

Both the X-axis automated repeat positioner 14 and the Y-axis automated repeat positioner 18 are coupled to a computer 20 which controls the reflective positions of the first and second reflective mirrors 12 and 16, to suitably reflect and/or redirect the ultraviolet, visible, infrared or other light radiation laser beam at a desired impinging location along the rear surface 24 of the field collimating lens or holographic component 22. As such automated control feature of the X-axis and the Y-axis automated repeat positioners 14 and 18 is conventional and well known in the art, a further detail discussion concerning the same is not provided.

A suitable X-axis automated repeat positioner or a Y-axis automated repeat positioner 14 or 18 is sold by Cambridge Technology of Cambridge, Mass., as 6870M Optical Scanner Heads. It is to be appreciated that other currently available scanners or repeat positioners, which facilitate accurate reflecting and/or redirecting of a supplied laser beam, at a desired location of an X, Y coordinate system, could also be employed with the teaching of the present invention.

The reflected ultraviolet, visible, infrared or other light radiation laser beam 4' enters the rear surface 24 of the field collimating lens or other holographic component 22, passes therethrough and is suitably altered in a conventional manner by the inherent characteristics of the field collimating lens or other holographic component 22 so that the ultraviolet, visible, infrared or other light radiation laser beam which is emitted from the front surface 26 of the field collimating lens or other holographic component 22 is a substantially collimated beam 28. This substantially collimated beam 28 is emitted and directed, by the front surface 26 of the field collimating lens or other holographic component 22, toward a desired area or portion of a rear surface 30 of a holographic imaging lens 32 and strikes and impinges on that desired area or portion.

The holographic imaging lens 32 is designed such that as the light enters by way of the rear surface 30 of one of the holographic imaging segments 36, the light will be focused, by that holographic imaging segment 36 of the holographic imaging lens 32, at a desired location or locations along a top surface 42 of the object to be processed O. The top surface 42 of the object to be processed O is located at a desired working distance D, for example, between 5 mm and 1000 mm, and preferably between about 200 to 300 mm from the front surface 38 of the holographic imaging lens 32. The altered light is emitted from the front surface 38 of the holographic imaging lens 32 as focused light beam 43.

This focused light beam 43 is directed at a desired location or locations-depending upon the inherent characteristics of the holographic imaging segment 36, along the top or other desired surface 42 of the object to be processed O for drilling, burning or otherwise forming a desired blind via(s), aperture(s), opening(s), indicia, indentation(s) or other surface formation(s) 44 therein of a desired size and a desired depth. It is to be appreciated that the size of the formation(s) 44 is determined and/or defined by the design characteristics of each holographic imaging segment 36 of the holographic imaging lens 32. In addition, the depth of the formation(s) 44 is a direct function of the duration or amount of pulses of the laser 2 emitted at the top surface 42 of the object to be processed. That is, the longer the duration or greater of the number of pulses of the laser 2, the greater the depth of the desired blind via(s), aperture(s), opening(s), indicia, indentation(s) or other surface formation(s) 44 in the object to be precessed O, while the shorter the duration or the smaller the number of pulses from the laser 2, the smaller the depth of the desired blind via(s), aperture(s), opening(s), indicia, indentation(s) or other surface formation(s) 44 in the object to be precessed O. As diagrammatically shown in FIGS. 1 and 2, the focused laser beam 43 is shown drilling, burning or otherwise forming a desired formation(s) 44, such as a blind via, in the top surface 42 of the object to be processed O.

An important distinction between the present invention and the prior art is that X-axis and the Y-axis automated repeat positioner 14, 18 are particularly adapted to reflecting the laser beam at only selected or desired rear area or areas of the holographic imaging lens 32, not the entire rear surface of the holographic imaging lens 32. As is conventionally done in the prior art, the scanners are employed to scan the laser beam across the entire rear surface of the holographic imaging lens, not only at a selected area or areas, as achieved by the present invention.

With reference to FIG. 3, a X-axis and Y-axis automated repeat positioner, a collimating lens and a holographic unit combined assembly 37 can be seen. The X and Y-axis automated repeat positioners are generally designated as 14, 18, the collimating lens or other holographic component 22 is located beneath the automated positioners, and the holographic imaging lens 32 is located to receive the collimated light from the collimating lens or other holographic component 22. The arrangement results in a compact design for the main components of the imaging system 1 of the present invention.

Figure 4:
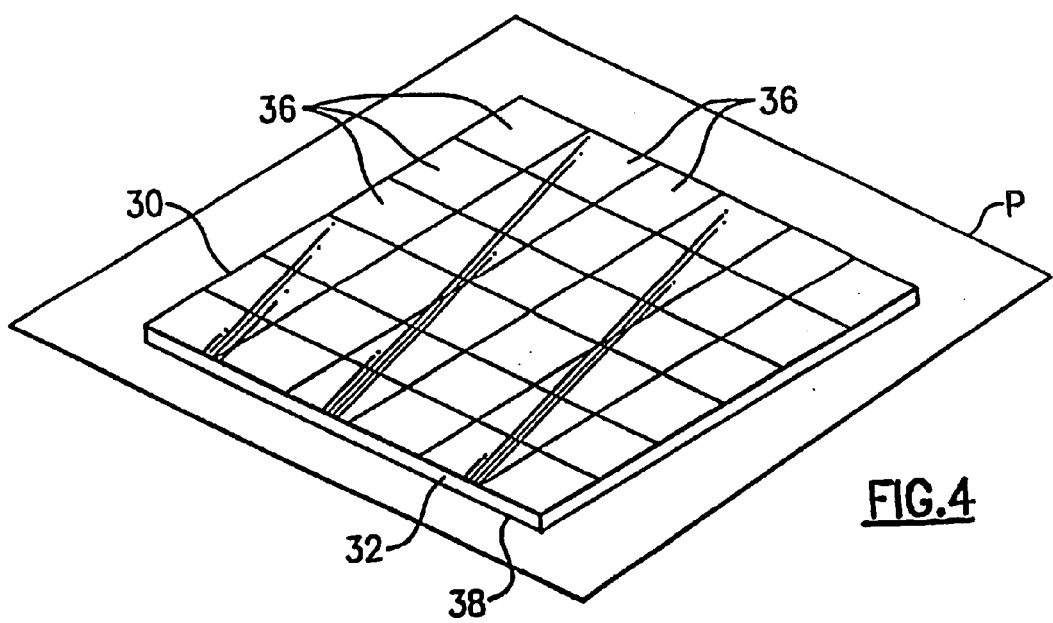
FIG. 4 is a perspective view diagrammatically showing a mask for use with the laser imaging system of the present invention.

As can be seen in further detail in FIG. 4, the holographic imaging lens 32, according to the present invention, is partitioned into a plurality of desired separate holographic imaging segments 36 and each holographic imaging segment 36 is designed to form, burn or drill at least one, and possibly two or more, desired size via, blind via, hole, aperture, indicia, indentation, feature or other formation 44 in the top surface 42 of the object to be processed O. The holographic imaging lens 32, as shown in FIGS. 1, 2 and 4, is partitioned into thirty-six (36) different holographic imaging segment 36 and each holographic imaging segment 36 is designed to form, according to the first embodiment, a corresponding blind desired blind via(s), aperture(s), opening(s), indicia, indentation(s) or other surface formation (s) 44 in the top surface 42 of the object to be processed O.

It is to be appreciated that the number of holographic imaging segments 36, being incorporated into the holographic imaging lens 32, can vary from application to application. Further, the number of desired blind via(s), aperture(s), opening(s), indicia, indentation(s), feature(s) or other surface formation(s) 44, to be formed by each holographic imaging segment 36, can be vary from application to application. Accordingly, the holographic imaging lens 32, according to the present invention, can be designed to drill, form or otherwise burn only a few or many tens of thousands of desired blind via(s), aperture(s), opening(s), indicia, indentation(s), feature(s) or other surface formation (s) 44 in the desired object to be processed O. The important feature, according to the present invention, is that all the holographic imaging segments 36 are arranged and located closely adjacent one another so as to all lie in the same plane P, which plane extends parallel to the top surface 42 of the object to be processed O, so as to be readily illuminated with the focused light beam 43.

The holographic segments 36 are either glued or otherwise are affixed to one another in a conventional manner or a perimeter retaining ring or some other retaining member encases and maintains the holographic segments in their close adjacent planar relationship. Alternatively, the holographic imaging lens 32 can be formed from a single unitary piece of material and each holographic segment can be designed to form the desired blind via(s), aperture(s), opening(s), indicia, indentation(s), feature(s) or other surface formation(s) 44.

According to the present invention, the X-axis and the Y-axis automated repeat positioners 14 and 18 are controlled by the computer 20, or other automated system to select the desired area or portion of the rear surface 24 of the field collimating lens or other holographic component 22 to be illuminated by the substantially collimated beam 28. The substantially collimated beam 28 passes through the field collimating lens or other holographic component 22 and emanates from a front surface 26 thereof toward the rear surface of a desired one of the holographic imaging segments 36 of the holographic imaging lens 32. The substantially collimated beam 28 strikes a desired area or portion, within the desired holographic imaging segment 36, and the substantially collimated beam 28 is focused, in a conventional manner, by the holographic imaging segment 36 to result in the focused beam 43 which facilitates drilling, burning, or formation of the desired blind via(s), aperture(s), opening(s), indicia, indentation(s), feature(s) or other surface formation(s) 44 in the top surface 42 of the object to be processed O.

The holographic imaging lens 32, which comprises a plurality of holographic imaging segments 36, can be obtained from a variety of sources such as, for example, Diffraction Ltd. of Waitsfield, Vt., Digital Optics Corporation, of Charlotte, N.C., MEMS Optical, LLC. of Huntsville, Ala. and Rochester Photonics Corp. of Rochester, N.Y.

It is to be appreciated that if a total of thirty-six (36) holes or formations 44 were to be formed in the top surface 42 of the object to be processed O, as shown in FIGS. 1 and 2, each one of the holographic imaging segments 36 of the holographic imaging lens 32 would be designed to form a single desired blind via(s), aperture(s), opening(s), indicia, indentation(s), feature(s) or other surface formation(s) 44 and be sequentially illuminated with the substantially collimated beam 28, in a desired sequential illumination order, for a desired number of pulses or a desired pulse duration. Alternatively, if only some desired blind via(s), aperture(s), opening(s), indicia, indentation(s), feature(s) or other surface formation(s) 44 are required to be burned, drilled or formed in the top surface 42 of the object to be processed O, but other desired blind via(s), aperture(s), opening(s), indicia, indentation(s), feature(s) or other surface formation (s) 44 are not required, only the holographic imaging segments 36 which are designed to form the desired blind via(s), aperture(s), opening(s), indicia, indentation(s), feature(s) or other surface formation(s) 44 in the top surface 42 of the substrate to be processed O are illuminated with the substantially collimated beam 28 while the holographic imaging segments 36, which would form the unwanted blind via(s), aperture(s), opening(s), indicia, indentation(s), feature(s) or other surface formation(s) 44 in the top surface 42 of the substrate to be processed O, are not illuminated with the substantially collimated beam 28.

The holographic imaging lens 32, as can be seen in FIG. 4, essentially comprises a plurality of separate holographic imaging lens or segments 36 which are all located closely adjacent one another, in a desired orientation and all lying substantially in the same plane P to form a continuous unitary component. This arrangement facilitates a compact design of the holographic imaging lens 32 and allows the system to selectively and readily control which holographic imaging segment or segments 36, of the holographic imaging lens 32, are activated during production of a desired substrate or object to be processed O via appropriate control of the X-axis and the Y-axis automated repeat positioners 14 and 18. Such construction provides the system, according to the present invention, with greater flexibility and allows variation in the amount and location of the desired blind via(s), aperture(s), opening(s), indicia, indentation(s), feature(s) or other surface formation(s) 44 to be formed, burnt or drilled in the top surface 42 of object to be processed O during commercial production of the same.

Figure 5:
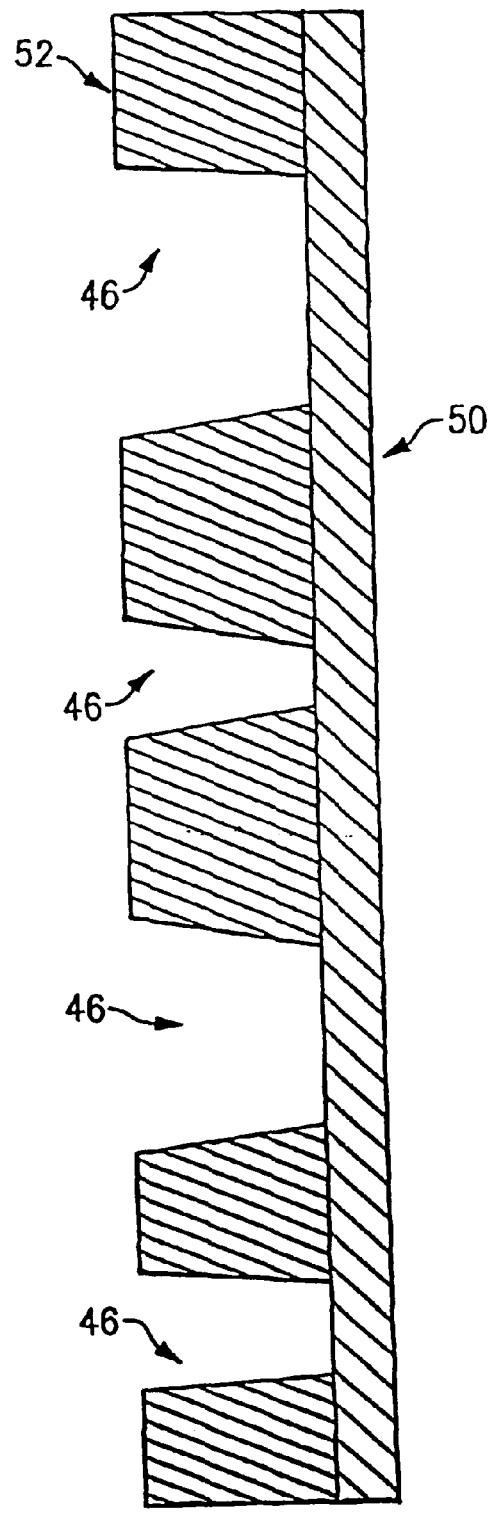
FIG. 5 is a diagrammatic transverse cross-sectional view of substrate having a plurality of different sizes blind vias formed therein by the laser imaging system of the present invention.

With reference to FIG. 5, an example of an object to be processed O can be seen. As shown in this Figure, the object to be processed O contains a base layer 50 which comprises, for example, a standard metal such as aluminum, copper, gold, molybdenum, nickel, palladium, platinum, silver, titanium, tungsten, metal nitrides or a combination(s) thereof. The thickness of the metal base layer 50 may vary but typically ranges between about 9 to about 36 $\mu$m and may be as thick as about 70 $\mu$m. The top layer 52 comprises, for example, a standard organic dielectric materials as BT, cardboard, cyanates esters, epoxies, phenolics, polyimides, PTFE, various polymer alloys, or combinations thereof. The thickness of the top layer 52 is generally thicker than the base layer 50 and typically ranges between about 50 to about 200 $\mu$m.

As can be seen in FIG. 5, a plurality of blind vias 46 are formed therein and some of the blind vias 46 can have different diameters. As noted above, the diameter of the blind vias 46 are determined by the focusing characteristics of the holographic imaging lens 32, e.g. the holographic imaging lens focuses the supplied collimated light beam 28 over a wider area to achieve larger diameter blind via and focuses the light over a narrower area to achieve narrower diameter blind via. In both cases, it is to be appreciated that the duration or number of pulses are controlled by the imaging system 1 to insure that the entire top layer 52 of the object to be processed O is obliterated to thereby expose the underlying metal base layer 50 while being of a substantially short enough intensity and duration so as not to in any way destroy or obliterate the underlying base layer 50.

Figure 6:
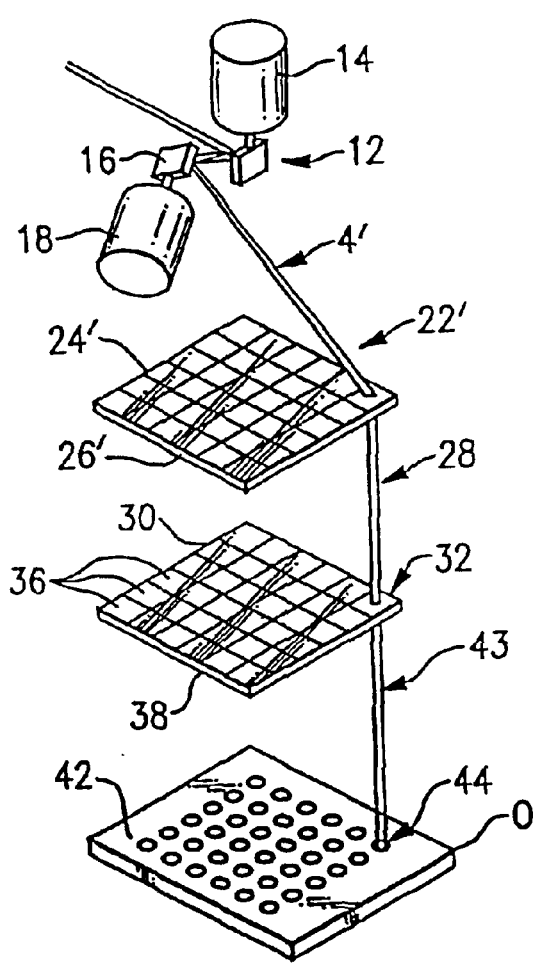
FIG. 6 is a diagrammatic perspective view of a second embodiment of the laser imaging system of the present invention.

It is to be appreciated that a variation of the holographic imaging lens, as shown in FIG. 6, can be substituted in place of the field collimating lens 22. If a collimating holographic imaging lens 22' is employed as the field collimating lens, then the collimating holographic imaging lens 22' is designed so as to receive light from the X-axis and the Y-axis automated repeat positioners 14 and 18 and redirect the supplied ultraviolet, visible, infrared or other light radiation laser beam 4, as a substantially collimated beam 28, at a desired rear surface of one of the holographic imaging segments 36 of the holographic imaging lens 32. The collimating holographic imaging lens 22' is designed to collimate the supplied light beam and redirect the beam 4' light toward the holographic imaging lens 32 so that the substantially collimated beam 28 enters the rear surface of the holographic imaging lens 32 at an angle of about of between about 0° to about 90° or some other predetermined angle depending upon the design parameters of the imaging system 1.

The inventors have appreciated that if the substantially collimated beam 28, supplied by the field collimating lens or other holographic component 22, is redirected at the rear surface of the holographic imaging lens 32 at an angle of about 45° or so, the efficiency of the holographic imaging lens 32 is significantly increased over the efficiency when the substantially collimated beam 28 is redirected at the rear surface of the holographic imaging lens 32 at an angle of about 90°. That is, the efficiency of the holographic imaging lens 32 is less when the substantially collimated beam 28 enters the rear surface of the holographic imaging lens 32 at an angle of about 90° while the efficiency increases if the substantially collimated beam 28 enters the rear surface of the holographic imaging lens 32 at a suitable angle of about between 0° and 90°. Accordingly, the desired angle in which the substantially collimated beam 28 enters the rear surface of the holographic imaging lens 32 can vary, from application to application, and can be determined by trial and error depending upon the parameters of the imaging system 1. Therefore, by using a collimating holographic imaging lens as the field collimating lens 22, the overall efficiency of this system can be increased without changing or modifying any of the other system requirements or parameters.

Figure 7:
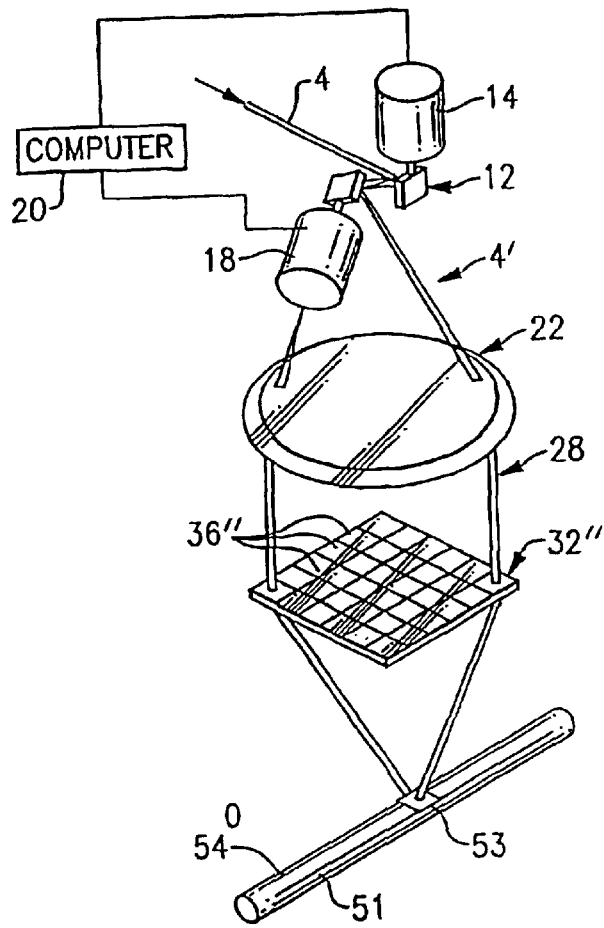
FIG. 7 is a diagrammatic perspective view of a third embodiment the laser imaging system, according to the present invention, for forming indicia on either a stationary or a moving object to facilitate use of the laser imaging system as a typewriter.

Turning now to FIG. 7, the holographic imaging lens 32 can be designed to result essentially in a holographic imaging keyboard 32", e.g. there can be twenty-six (26) holographic imaging segments 36" with each holographic segment being designed to form, burn or drill a one of the 26 letters of the alphabet, an additional ten (10) holographic imaging segments 36" with each additional holographic segment being designed to form, burn or drill one number from zero through 9, and a further plurality of holographic imaging segments 36" with each further holographic segment being designed to form, burn or drill desired punctuation, indicia, emblem, design logo, etc. By operation of the laser (not shown in this Figure) and adequately controlling of the X-axis and the Y-axis automated repeat positioners 14, 18, via the computer 20 as described above, the ultraviolet, visible, infrared or other light radiation laser beam 4 can be suitably collimated and supplied at a rear surface of a desired one of the holographic imaging segments 36" of the holographic imaging keyboard 32" to type, drill or form a desired letter, numeral, indicia, etc., in a top surface of an object to be processed, e.g. a cable or wire 51 running at high speed which is to have a desired marking, such as "A 0903 C", formed in an exterior surface thereof.

According to this embodiment, each image or other indicia to be formed by the holographic imaging keyboard 32" is focused by an appropriated one of the holographic imaging segments 36", once that segment is struck with the supplied ultraviolet, visible, infrared or other light radiation laser beam 4, to form the desired indicia at the same area or "printing location" 53. Accordingly, during operation of the imaging system 1, as a cable or wire 51, for example, moves past the "printing location" 53, the X-axis and the Y-axis automated repeat positioners 14, 18 are controlled by the computer 20 to select the desired one of the holographic imaging segment(s) 36" so as to type, burn, drill or form a desired letter, numeral, character, indicia, etc., in an exterior surface 54 of the wire 51 or other object as the wire 51 moves past the "printing location" 53. It is to be appreciated that the system, according to the present invention, incorporating the holographic imaging keyboard 32" operates at a very high speed such that the desired letter, numeral, character, indicia, etc., are essentially printed in sequential order, one after the other, to result in a desired imprinted pattern, e.g. "A 0903 C", on the wire 51.

Instead of using alphanumeric characters for the keyboard, each segment 36" can be provided with suitable light altering information for forming a desired bar code or other convention and when known marking indicia on an exterior surface of an object as it moves relative to the imaging system 1 or remains stationary at the "printing location" 53. As such teaching is conventional and well known to those skilled in the art, a further detailed description concerning the same will not be provided.

The above described embodiment is particularly useful for marking alphanumeric characters at a rate that is approximately double the rate of any known marking system currently available on the market. The imaging system 1 uses a specially designed segmented array to create the required surface marks, which may be, for example, bar codes, letters, numbers, punctuation marks, logos, foreign characters, etc. This segmented array is designed to image every character of the array at the same location while the object or component, requiring the surface marking, is suitably moved or indexed relative to the printing zone or location 53 so as to mark the desired bar code(s), letter(s), number(s), punctuation mark(s), logo(s), foreign character(s), etc., in the exterior surface of the object or component.

A further application of the imaging system 1, according to the present invention, is to for use with marking different fiber materials with a code or code identifying or designating a specific production batch number(s), date(s), production facility, and other desired information that would be helpful or beneficial to a forensic investigator(s) when investigating a crime scene or when explosives have been used. Such small fibers can be made from a host of materials such as Kevlar®, carbon, glass, quartz, stainless steel, plastic, etc. The imaging system 1, according to the present invention, will allow these fibers to be effectively processed or marked, at extremely low costs and at a high speed, to assist with identification.

A further application of the present invention is two-dimensional bar code marking at high speed. The imaging system 1, according to the present invention, can be configured to provide high speed production marking of two-dimensional bar codes onto a either a stationary or a moving surface of a product or object. The system's segmented lens array can be used to image a series or group of associated indentations or other surface markings that can be formed into a two-dimensional bar code or other indicia that can be read using standard optical character recognition software. This method and system for marking is similar to the way the present invention drills, burns or forms the holes of a nozzle array except the system will only sufficiently mark the top surface to form the desired two-dimensional bar code character or other indicia. It is to be appreciated that a plurality of closely arranged and aligned indentations or surface marks will comprise or form each desired bar code(s), letter(s), number(s), punctuation, mark(s), logo(s), foreign character(s), etc. The imaging system 1 offers an extremely high rate marking capability that is currently not available by prior art marking systems.

Figure 8:
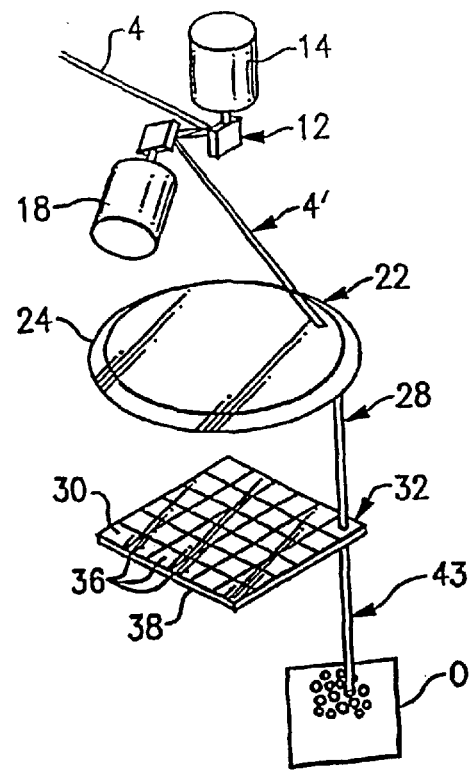
FIG. 8 is a diagrammatic perspective view of a fourth embodiment the laser imaging system, according to the present invention, for forming a desired nozzle array on a stationary object.

It is to be appreciated that the imaging system 1, of the present invention, can be used to perforate a plurality of small orifices or holes (see FIG. 8), in a single or a multi-layered material, to enable the formation of a desired nozzle array for use in forcing a liquid (e.g. a perfumed, a solvent, a pharmaceutical, a chemical, etc.) therethrough to result in a desired spray configuration or pattern. The force fluid, upon exiting from the nozzle array, is atomized into small minute particles and dispersed in a desired spray configuration at a target. The imaging system, according to the present invention, allows the formation of such orifices, nozzles, holes, etc., in a variety of different materials including, but not limited to, stainless steel, polyimide, lexan, brass, molybdenum, copper, aluminum, etc, for example.

The present invention is also well-suited for forming a set of miniature surface markings on an interior surface adjacent a breech end of a gun barrel of a firearm. In particular, the present system can be employed to form a desired unique bar code, matrix, an alpha numeric code, or any desired identifying indicia on an inner surface of the firearm, adjacent the breech end of the gun barrel. Once the gun barrel is suitably processed or marked with the identifying indicia, when the firearm is discharged in a conventional manner, the loaded gun shell normally expands slightly, due to the gunpowder within the gun shell instantaneously igniting and heating the gun shell. This rapid expansion of the gun shell causes the exterior surface of the gun shell to be forced against the inwardly facing surface adjacent the breech end of the gun barrel such that the identifying indicia, formed on the inwardly facing surface of the breech end of the gun barrel, forms a mating or matching impression or marking on the exterior surface of the gun shell. Upon discharge of the gun shell from the gun barrel, this matching impression or marking facilitates identifying which gun shell was discharged from which gun barrel. Such marking of the gun shell assists ballistics experts with confirming that a particular gun shell was discharged from a particular barrel of a firearm. If desired, a plurality of identical miniature surface markings can be formed, at spaced locations about the interior surface adjacent the breech end of a gun barrel of a firearm, to make it more difficult for an end user to located and completely remove all of such miniature surface markings from the interior surface of the breech end of the gun barrel so processed or marked. A further description is provided below.

Figure 9:
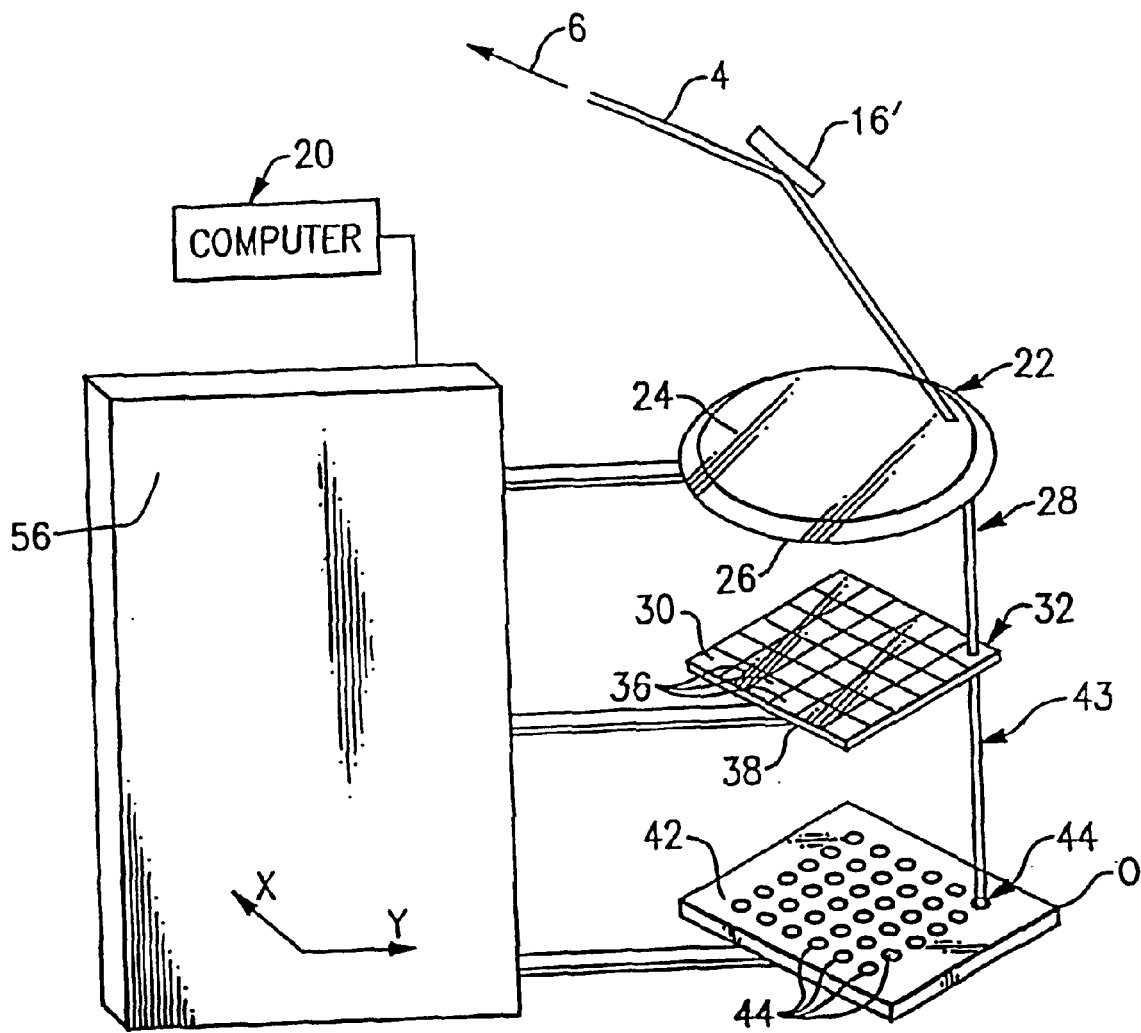
FIG. 9 is a diagrammatic perspective view of a fifth embodiment of the laser imaging system, according to the present invention.
Figure 10:
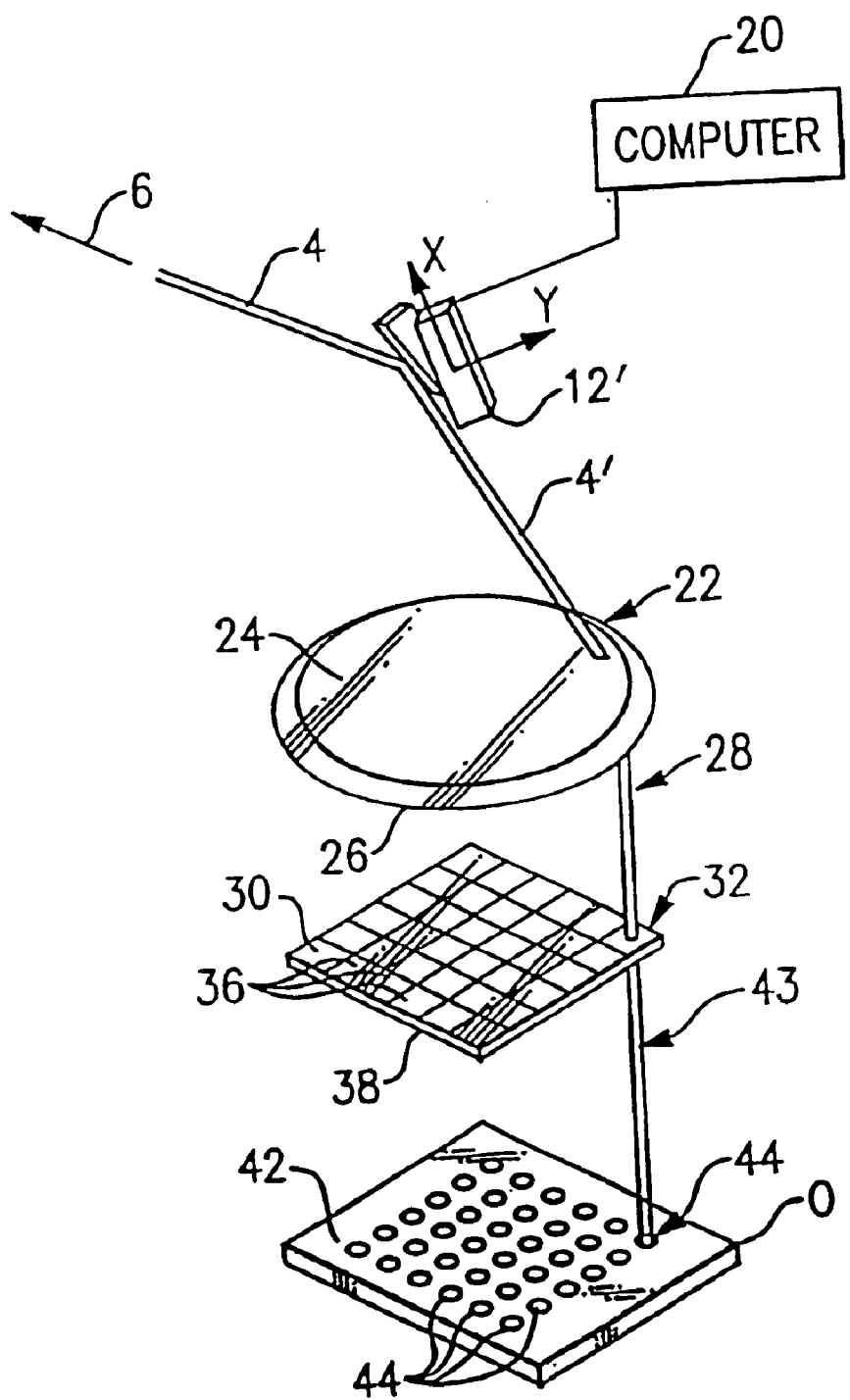
FIG. 10 is a diagrammatic perspective view of a sixth embodiment of the laser imaging system, according to the present invention.

It is to be appreciated that a plurality of identical imaging systems 1, each similarly to any one of the above described embodiments, can be simultaneously used in combination with one another to form, drill or burn a desired matrix of features in the same object to be processed O. Further, it is to be appreciated that there are a variety of different arrangements that could be utilized to move the object to be processed O relative to the focused beam 43. For example, the object O, the field collimating lens other holographic component 22, and the holographic imaging lens 32 can all be mounted on a table 56 which is movable in the X-axis and the Y-axis directions and coupled to the computer 20 for controlling movement of the table 56 relative to the focused beam 43 (FIG. 9). Alternatively, the X-axis Y-axis repeat positioner 14, 18 can be replaced with a single mirror mounted on a table 12' and movable in both the X- and Y-axis directions (FIG. 10). This table 12' is also coupled to the computer 20 and appropriately moves to redirect the light beam 4 to a desired rear surface of the field collimating lens other holographic component 22 to facilitate illumination of a desired one of the holographic imaging segments 36. As such teaching in conventional and well known in the art, a further detailed description concerning the same is not provided.

Figure 11:
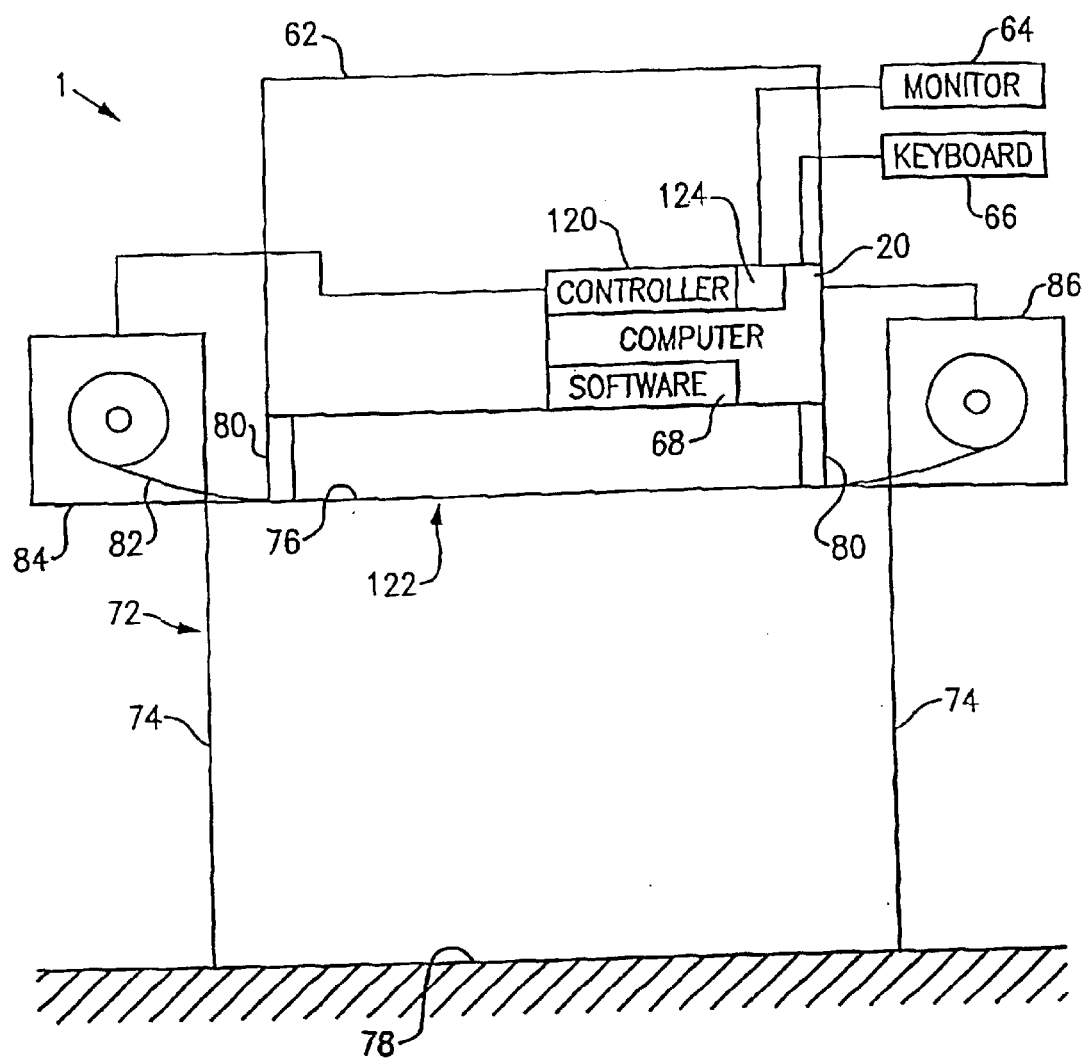
FIG. 11 is a diagrammatic view showing peripheral components for use with the imaging system according to the present invention.

With reference to FIG. 11, an embodiment is shown in which the entire imaging system 1 is diagrammatically housed within an enclosure 62. The enclosure 62 also accommodates the computer 20 which is coupled, as described above, to control operation of the imaging system 1. In addition, a monitor 64 as well as a keyboard 66 are coupled to the computer 20. The keyboard 66 facilitates inputting of a desired command(s), by an end user, to the computer 20 for controlling operation of the imaging system 1 and the monitor 64 facilitates viewing of any such entered command(s) as well as viewing of any warnings, error(s), messages, instructions, queries, data, information, etc., to be displayed by the imaging system 1. Computer software 68 is incorporated, in a conventional manner, into the computer 20 which facilitates operation and control of the laser 2 and the X-axis and Y-axis automated repeat positions 14, 18 as well as controlling relative movement between the object to be possessed O a remainder of the imaging system 1.

The support frame 72 generally comprises four legs or sides 74 (only two of which are shown in FIG. 11) which facilitates supporting a top working surface 76 at a desired distance from a floor or ground surface 78. As can be seen in FIG. 11, all of the components of the imaging system 1 are housed within the enclosure 62 which is suspended, at a fixed location by additional framework 80, a desired working distance D above a central area of the working surface 76. A desired object to be processed or marked 82 with blind via(s), aperture(s), opening(s), indicia, indentation(s), feature(s) or other surface formation(s) 44, e.g. a flexible coated or uncoated web, can be unwound and dispensed via conventional web dispensing equipment 84 and conveyed across the working surface 76 of the imaging system 1 of the present invention. As the desired object to be processed or marked 82 is conveyed across the working surface 76, the top surface of the desired object to be marked 82 is suitably marked, e.g. formed, burnt or drilled, with the desired blind via(s), aperture(s), opening(s), indicia(s), indentation(s), feature(s) or other surface formation(s) 44.

Following such marking, the processed object to be marked 82 is then rewound by conventional rewinding equipment 86 and ultimately conveyed, in a known manner, to other operation(s) for further processing. It is to be appreciated that the dispensing equipment 84 and the rewinding equipment 86 are both coupled to the computer 20, via conventional electrical couplings, to facilitate control of either uniform sequential indexing or continuous feed, of the desired object to be processed or marked 82, at a desired processing speed along the working surface 76 of the imaging system 1 to facilitate marking of the desired object to be processed or marked 82 at a desired production rate.

Figure 12:
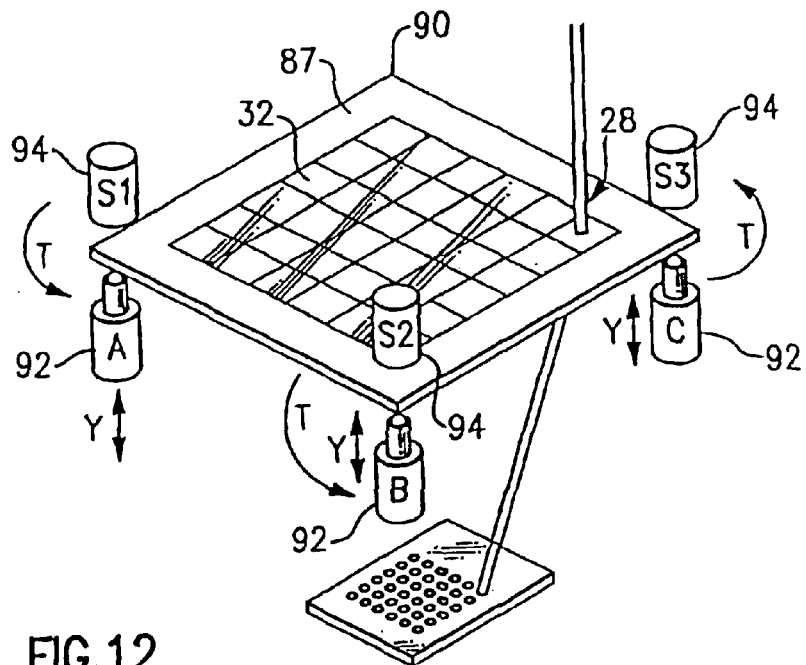
FIG. 12 is a diagrammatic perspective view showing a horizontal adjustment mechanism for the holographic imaging lens.

In a preferred form of the present invention, the holographic imaging lens 32 is supported by a holographic imaging array plate 87 which is mounted by a horizontal adjustment mechanism 88 (FIG. 12) to facilitate aligning the horizontal plane P of the holographic imaging lens 32 so that this horizontal plane is position exactly parallel with the top working surface 76 of the imaging system 1. To facilitate such alignment, preferably one corner or portion of the holographic imaging lens 32 is fixedly mounted 90 to the enclosure 62 (not shown in detail) but that corner is allowed to pivot relative thereto. Each of the three other corners or portions of the holographic imaging lens 32 are also supported by a separate linear actuator 92. Each one of these three linear actuators 92 is coupled to a mating position sensor feedback device 94 and all of the linear actuators 92 and their associated position sensor feedback devices 94 are coupled to the computer 20 to facilitate controlling operation of those components.

Prior to processing of the desired object by the imaging system 1, the computer 20 sequentially actuates each one of the imaging segments 36, comprising the holographic imaging lens 32, to confirm that the working distance D between the holographic imaging lens 32 and the working surface 76 of the imaging system 1 are correctly positioned and/or that the holographic imaging lens 32 is aligned exactly parallel with respect to the working surface 76. In the event, that any adjustment of the holographic imaging lens 32 relative to the working surface 76 of the imaging system 1 is required, a suitable one or ones of the linear actuators 92 is/are supplied with electrical power to operate an internal drive (not shown in detail) in a first direction to raise that end portion of the holographic imaging lens 32, along a Z-axis extending perpendicular to the working surface 76, by a suitable distance, or in an opposite direction, along the Z-axis extending perpendicular to the working surface 76, to lower that end portion of the holographic imaging lens 32 by a suitable distance. Once this occurs, the computer 20 then again actuates each one of the imaging segments 36 to verify whether on not the holographic imaging lens 32 is properly horizontally aligned with the working surface 76. This alignment procedure continues until the computer 20 determines that the holographic imaging lens 32 is suitably horizontally aligned with respect to the working surface 76.

Figure 13:
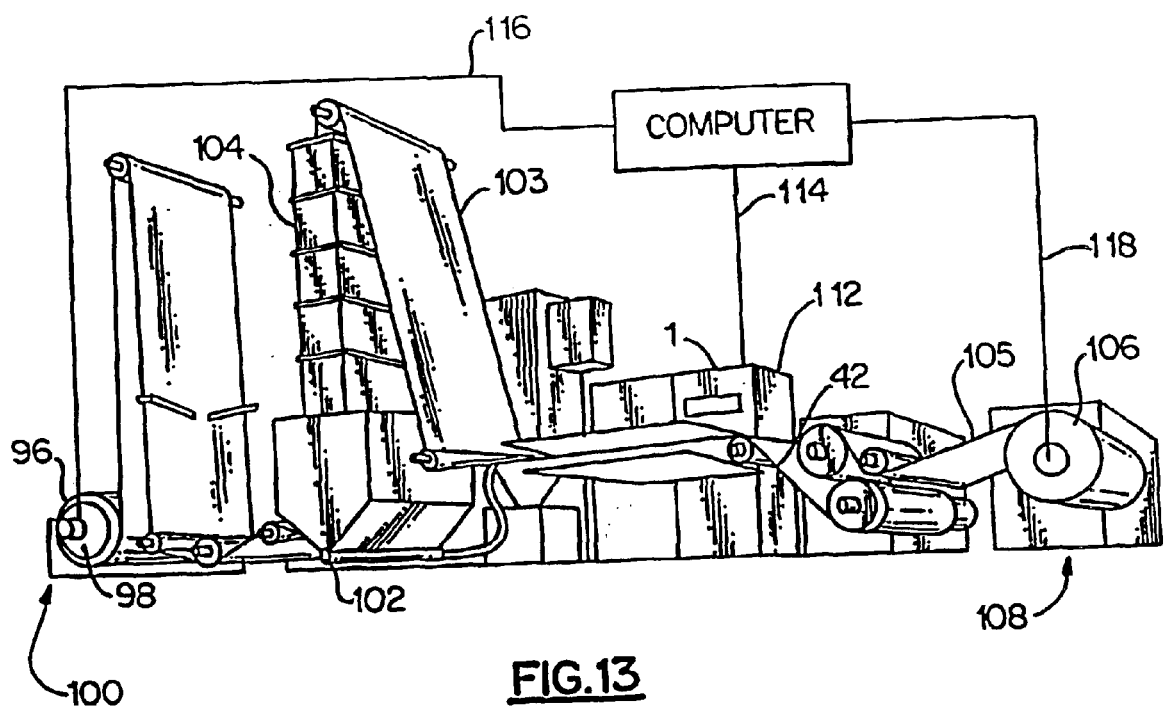
FIG. 13 is a diagrammatic perspective view showing incorporation of the imaging system, according to the present invention, as part of a production line for processing a web.

With reference to FIG. 13, incorporation of the imaging system 1, according to the present invention, as a component and incorporated in part of a production line, will now be briefly described. As can be seen in FIG. 13, an uncoated web 96 is initially manufactured by a conventional process and wound a core 98. The core 98 is supported by conventional dispensing or unwinding equipment 100 to facilitate unwinding of the uncoated web 96 in a uniform manner. During operation, the uncoated web 96 is transported, as is typical in this art, over a plurality of spaced rollers (not numbered) and fed into an inlet of a powder coater 102 where a suitable coating, e.g. powder, metal deposition, dielectric deposition, is applied to either one or both opposed surfaces of the uncoated web 96. The thus coated web 103 is then conveyed through an oven 104 where the heat emitted from the oven facilitates adhesion of the powder coating to one of both surfaces of the coated web 103.

Next, the coated web 103 is conveyed over a plurality of spaced rollers (not numbered) and fed across the working surface 76 of the imaging system 1, according to the present invention, where the desired blind via(s), aperture(s), opening(s), indicia(s), indentation(s), feature(s), or other surface formation(s) 44 are formed, burnt or drilled, as described above, in the top surface 42 of the coated web 103. Finally, the coated and appropriated processed or marked coated web 105 then passes over a plurality of spaced conventional rewind rollers (not numbered), to facilitate proper rewinding of the coated and appropriated processed or marked coated web 105, and is wound on a rewound core 106 by conventional rewind equipment 108. The rewound core 106 of suitably coated and appropriated processed or marked web 105 can then be further processed, as required by conventional equipment in a known manner.

In a preferred form of the invention, a machine vision camera 112 (only diagrammatically depicted in FIG. 13) is coupled to the computer 20 of the imaging system 2, via a conventional cable 114, for observing the object to be processed O to view the drilling, burning, and/or formation of the desired blind via(s), aperture(s), opening(s), indicia(s), indentation(s), feature(s), or other surface formation(s) 44 in a desired surface of the object to be processed O. Once the desired blind via(s), aperture(s), opening(s), indicia(s), indentation(s), feature(s), or other surface formation(s) 44 are formed, burnt or drilled in the object to be processed O by the imaging system 2, the object to be processed O can then be further manipulated by the production line, e.g. be rewound on a core, can be package or further conveyed, etc., depending upon the particular application. The computer 20 is typically electrically connected, by a cable 116 and 118, to motors (not shown) which control drive of the dispensing or unwinding equipment 100 and the rewinding equipment 108 for controlling further manipulation or manufacturing, inspection, transportation, processing, sorting, orientation, etc., of the object to be processed O As such teaching is well known in the art and as the present invention primarily relates to the imaging system 2, a further detailed description concerning the machine vision camera 112 and its associated components are not provided.

The improved control system for the laser 2, the X-axis and Y-axis repeat positioners 14, 18 and the relative movement of the product to be imaged O, e.g. conveyance of the product via a movable table or conveyor or movement of the product to be imaged O relative to the other two components, according to the present invention, will now be discussed. The present invention employs a controller 120 (FIG. 11), which is incorporated in the computer 20, which synchronizes operation of the X-axis and Y-axis repeat positioners 14, 18, the product handling system for the product to be imaged O (for moving the product along the X- and Y-axes relative to the other two components) generally designated as 122, and the laser 2, so that all three components operate at an optimum performance level to facilitate increased production efficiency.

The controller 120, according to the present invention, generates the necessary commands to drive the X-axis and/or Y-axis repeat positioners 14, 18, the product handling system 122 for the product to be imaged O and/or the laser 2.

The controller 120, according to the present invention, is designed to employ one of the following three command structures, or variations thereof as discussed below, to increase the stepping speed of the X-axis and/or Y-axis repeat positioners 14, 18, across the field of the product to be imaged O, the X-axis and/or the Y-axis movement of the product handling system 122 for the product to be imaged O and the laser 2, to reduce any undesired wait, delay or dwell time of the laser 2, the product handler or a cutting tool and thereby increase the production speed of the product to be imaged O.

During set up of a product to be processed O, the system starts at step 200 (FIG. 14), and the end user, the operator or the system programmer is first allowed to input or select, at step 210, the frequency that the imaging system 1 will operate—the frequency range generally is between 1 and 100 kHz. The end user, the operator or the system programmer is also allowed, at step 220, to input the desired number of pulses—the pulse range generally is between 1 and 100,000 pulses. The frequency and number of pulses determine the duration of the laser beam when fired by the laser 2. The maximum frequency of these pulses, at a 50 percent duty cycle, provides the necessary minimum pulse width.

Next, the end user, the operator or the system programmer selects one of the following command structures, at step 230, to control operation of the above three components and facilitate increased production of the product to be processed.

The first command structure, according to the present invention, operates as follows:

POab=O1, O2, W, F, N where a and b must be defined as part of a special set of two sets hard-coded axes (i.e. either always the X and Y-axes or the Z and W);

O1 is the offset sent to the first axis (i.e. one of the repeat positioners);

O2 is the offset sent simultaneously to the second axis (i.e. the other of the repeat positioners);

W is the time the imaging system will wait, in milliseconds, once all the components are correctly position prior to firing the laser;

F is the frequency of the laser; and

N is the number of pulses of the laser to be sent.

Figure 15:
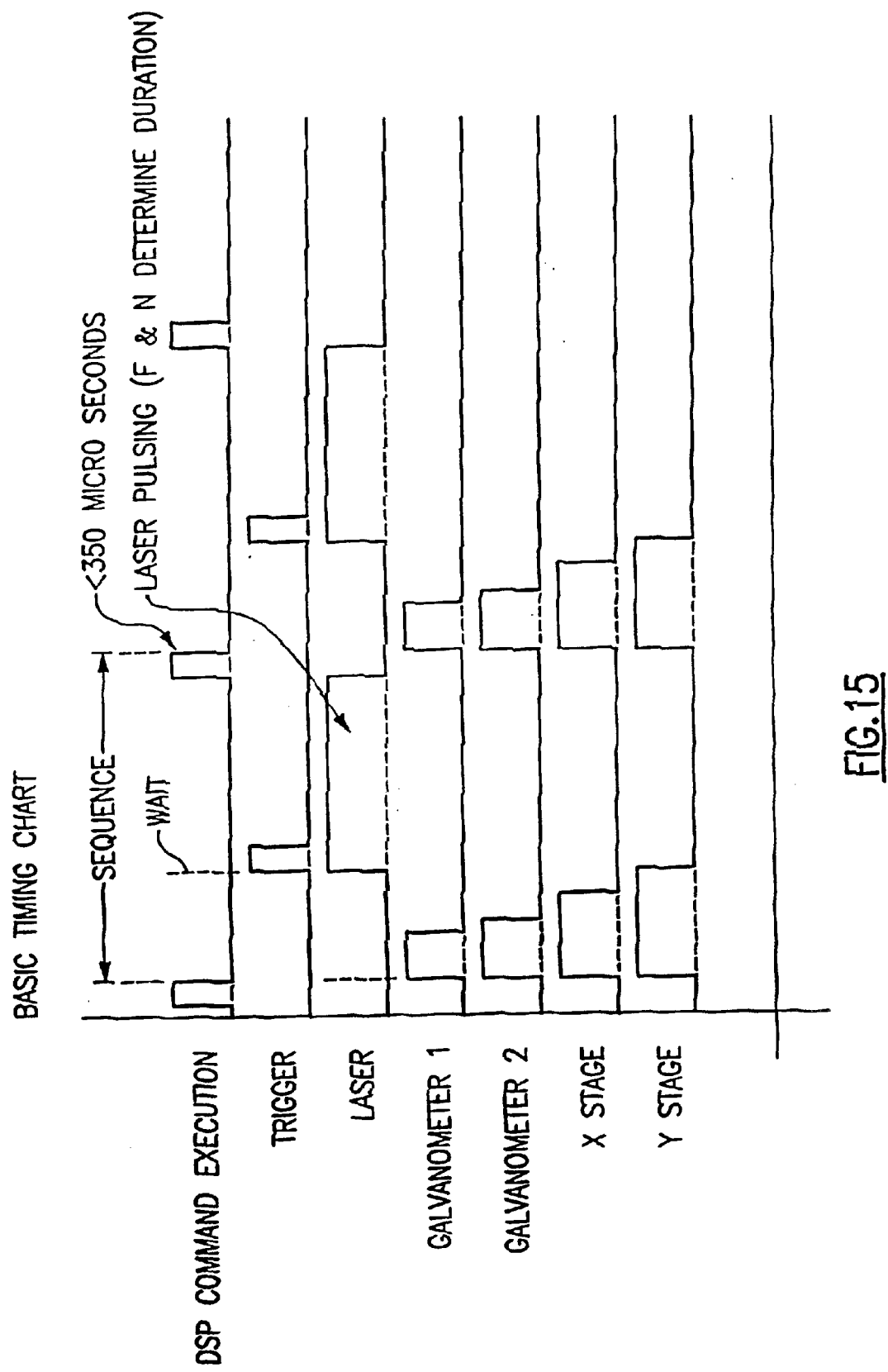
FIG. 15 is a diagram showing an example of a timing chart achieved by the flow diagram of FIG. 14.

The controller 120 (e.g. the digital signal processor (DSP)) then reads, from the drill position data table 124, e.g. the memory device of FIG. 13, at step 240, the necessary values which have been previously stored therein in a conventional manner and this read function normally takes 350 milliseconds, as can be seen in FIG. 15. Immediately following the reading step, the controller 120 then simultaneously sends the necessary signals, in a conventional manner at step 250, to execute motion of the X-axis and/or Y-axis repeat positioners 14, 18, the handling system 122 for the product to be imaged O, e.g. the X stage and/or Y stage, and/or the triggering of the laser 2 to the positions read from the drill position data table.

As depicted in FIG. 15, the X-axis repeat positioner (e.g. galvanometer 1), the Y-axis repeat positioner (e.g. galvanometer 2), the X-axis product handler (e.g. X stage) and the Y-axis product handler (e.g. Y stage) are all driven by the controller 120 immediately following completion of the read sequence, at step 240. Once a desired end position by each one of those components being driven by the controller 120 to a designated position is achieved, each component generates and sends, at step 260, a feed back signal which is received by the system controller, at step 270. As is conventionally done in the art, the control routine will monitor the X-axis repeat positioner and the Y-axis repeat positioner to determine when the error signal voltage, for each of the repeat positioners, achieves the desired voltage. When this occurs, the control routine knows that the X-axis repeat positioner and the Y-axis repeat positioner are located at the exact position dictated by the information read from the drill position data table. A feedback position signal for the X-axis product handler and the Y-axis product handler is also conventionally obtained. For example, the control routine will count pulses to determine when the X-axis product handler and the Y-axis product handler are in the exact position dictated by the data read from the drill position data table. As is conventional done in the art, a PID loop is provided to compensate for any overshoot of the X-axis or Y-axis product handlers to precisely locate the X-axis and the Y-axis repeat positioners at the exact desired location.

Once a feed back signal is received from all of the components required to be moved, prior to the firing of the laser 2, a wait period W occurs at Step 275. The wait period W is generally a small programmed delay or dwell time, e.g. between 2–10 microseconds, to allow the moving components to stabilize somewhat prior to firing the laser 2. At the end of the wait period W, the trigger is immediately activated, at step 280, and the trigger, in turn, causes the laser 2 to be fired at step 290, generally on the rise of the trigger, for a predetermined period of time. Therefore, generally another signal will be sent to each of the X-axis and/or Y-axis repeat positioners 14, 18, the X-stage and/or the Y-axis stage of the handling system 122 for the product to be imaged O and/or the laser 2 to again change their positions although the position of one or more of those components may not require movement prior to next firing of the laser 2.

Assuming the controller routine determines, at step 300, that the laser 2 is required to be fired an additional time(s), the control routine returns to step 240 and the controller 120 then reads, from the drill position data table, the next set of necessary values which have been stored therein and the control routine repeatedly repeats steps 250 to 300, as necessary. If the control routine determines that the laser 2 is not required to be fired an additional time, the controller routine ends at step 310.

A second command structure, according to the present invention, operates as follows:

Plab=O1, O2, F, N where, similar to the first command, a and b must be defined as part of a special set of two sets hard-coded axes (i.e. either always the X- and Y-axes or the Z and W);

O1 is the offset sent to the first axis (i.e. one of the repeat positioners);

O2 is the offset sent simultaneously to the second axis (i.e. the other of the repeat positioners);

F is the frequency of the laser; and

N is the number of pulses of the laser to be sent.

Figure 14:
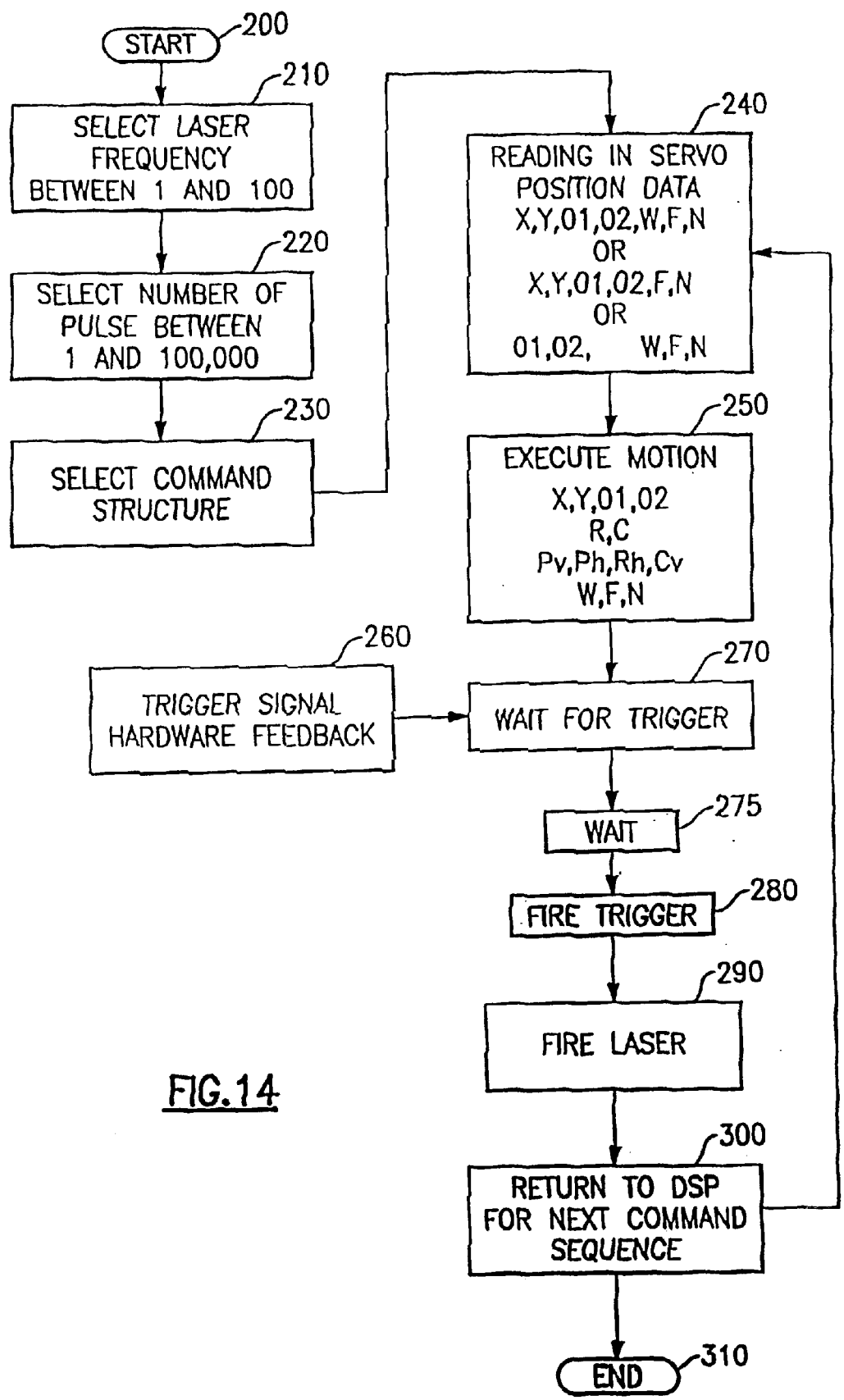
FIG. 14 is a flow diagram showing first embodiments of a command structure for providing improved performance of the imaging system of the present invention.

Accordingly to the second command structure, however, as two digital inputs are utilized, a waiting or dwell time W is not necessary before firing the laser 2, i.e. step 275 of FIG. 14 is eliminated. The second command effectively sets the O1 and O2 offsets for the defined axes. Approximately 1 millisecond after the offsets are sent by the controller 120, the controller 120 will begin polling or checking for a change in state on both of the inputs or the feed back signals. Immediately following the controller 120 detecting a change in state, the trigger is activated and the necessary laser pulses are sent out immediately (e.g. typically less than about 1 millisecond). The maximum delay will, therefore, come from the controller 120 detecting the change of state which is updated on the sample and can be a maximum of one sample period.

A third command structure, according to the present invention, is operates as follows:

Plabxy=X, Y, O1, O2, R, C, Pv, Ch, W, F, N where, similar to the first and second commands, a and b must be defined or determined as part of a special set of two sets hard-coded axes (i.e. either always the X- and Y-axes or the Z and W);

X is the X-axis stage offset for the product handling system;

Y is the Y-axis stage offset for the product handling system;

O1 is the offset sent to the first axis (i.e. one of the repeat positioners);

O2 is the offset sent simultaneously to the second axis (i.e. the other of the repeat positioners);

R is the number of steps and repeat rows for the array;

C is the number of steps and repeat columns for the array;

Pv is the pitch distance between each complete array in the vertical direction;

Ph is the pitch distance between each complete array in the horizontal direction;

Rv is the number of complete arrays in the vertical direction with respect to the pitch (Pv and Ph);

Ch is the number of complete arrays in the horizontal direction with respect to the pitch (Pv and Ph);

W is the time the imaging system will wait in milliseconds;

F is the frequency of the laser; and

N is the number of pulses of the laser to be sent.

The third command structure allows a whole array to be stepped and repeated to form rows and columns of individual arrays. This command, as well as variations thereof briefly set forth below, allows the controller 120 to run very efficiently because the command reads from a database at a speed that is several orders of magnitude faster than a read for conventional prior art systems.

The steps for this control routine (see FIG. 16) are substantially identical to that of FIG. 14, and thus not discussed in further, except that an additional step, step 295, is provided between wait step and the step of control routine returning to step 240 to read, from the drill position data table, the next set of necessary drill position data which is stored therein.

Figure 16:
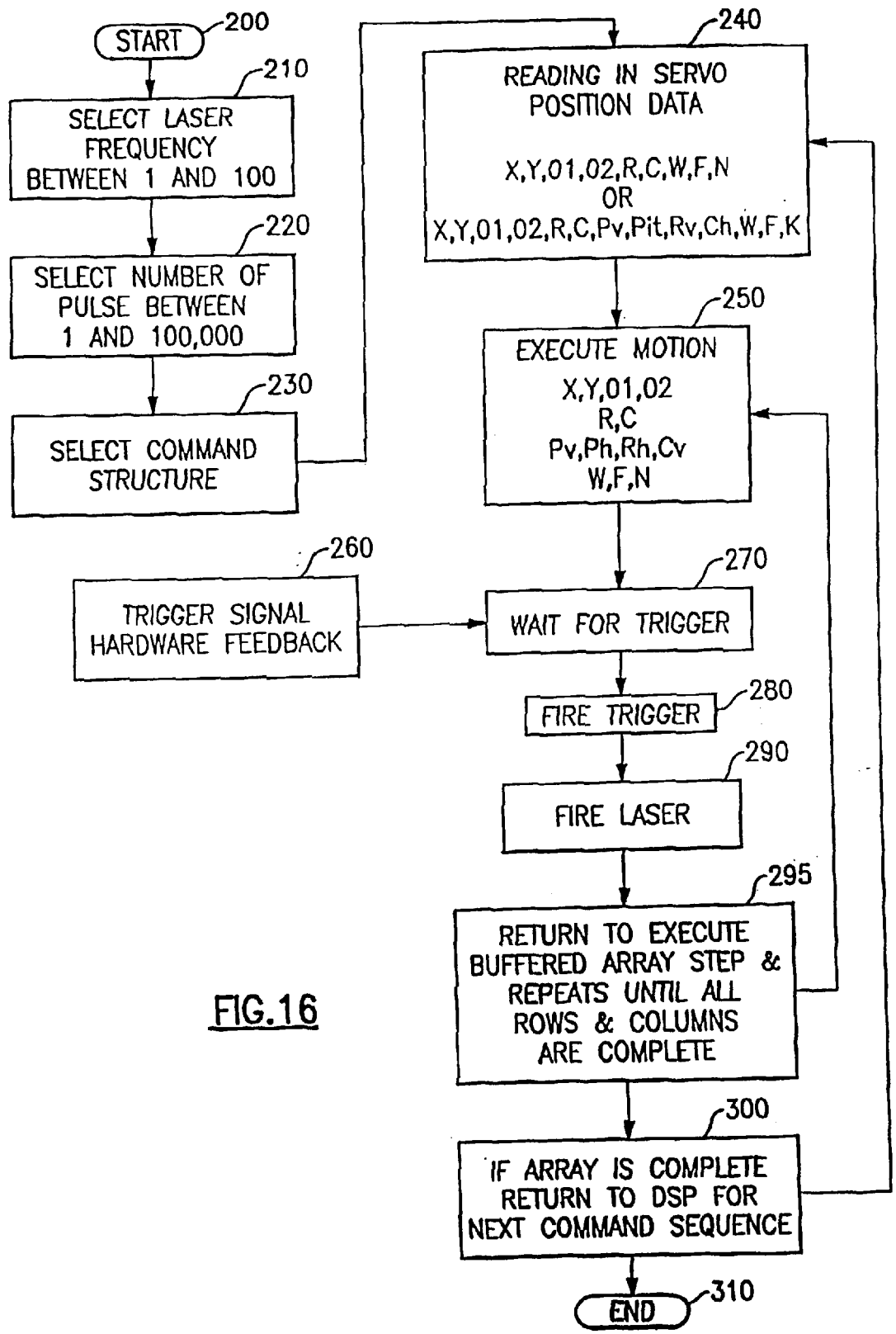
FIG. 16 is a flow diagram showing second embodiments of a command structure for providing improved performance of the imaging system of the present invention.
Figure 17:
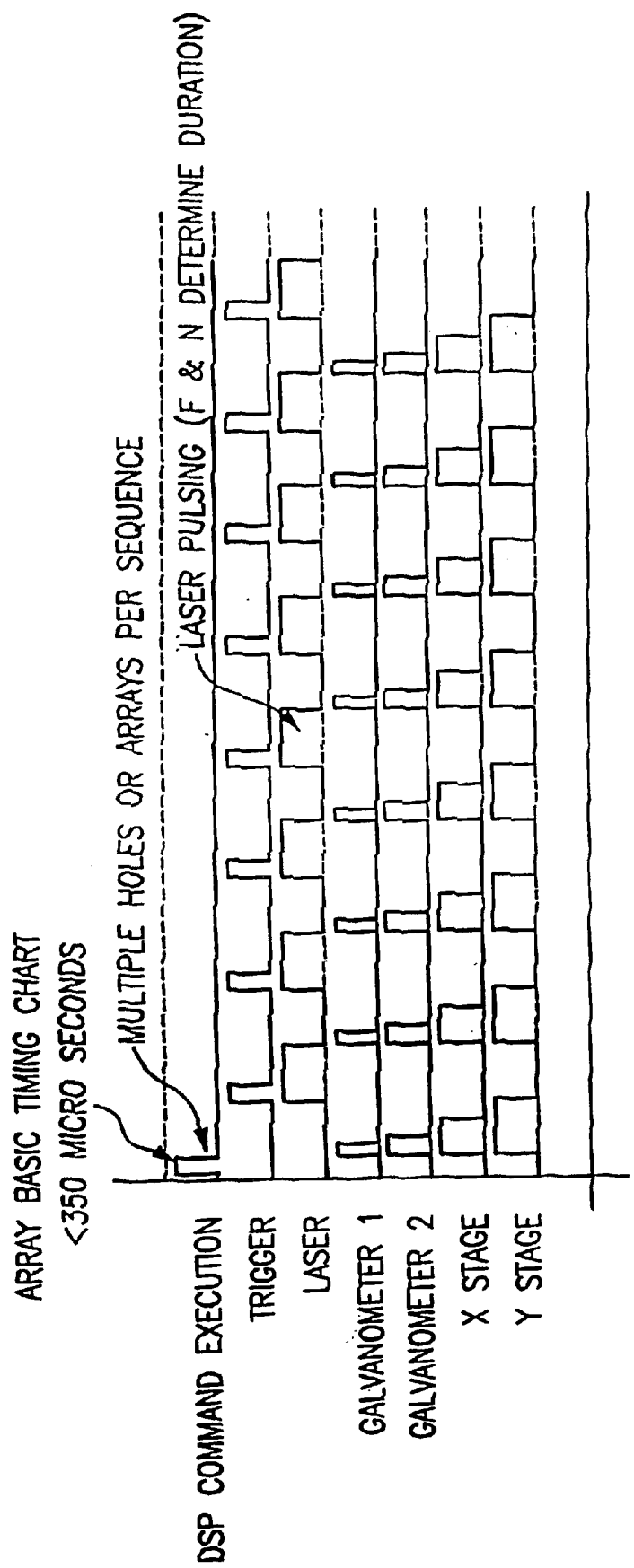
FIG. 17 is a diagram showing an example of a timing chart achieved by the flow diagram of FIG. 16.

A basic timing chart, for the control routine according to FIG. 16, is shown in FIG. 17. As can be seen in that Figure, the controller 120 (DSP command execution) is only executed once while the galvanometer 1, galvanometer 2, the X-stage and the Y-stage are moved to a plurality of locations and the laser 2 is triggered to fire after each move. This occurs a plurality of times before the controller 120 is required to return and read further information from the drill position data table.

For example, if the imaging system 1 was producing three holes employing either the first or the second command, such command would require the controller 120 to seek and load a separate command sequence (see FIG. 15) following each firing of the laser 2, i.e. three separate seek and load commands. It is to be appreciated that each seek and load sequence of the controller 120 takes 350 microseconds, at a minimum. So the traditional controller command sequence for three holes would be 1,050 microseconds (e.g. 3×350 microseconds) and this time period is equivalent to 1.05 milliseconds.

As the third command is using an array style structure, it would only require one third of that time period, namely, only 350 microseconds, because the controller 120 only seeks and downloads one command, not three separate commands as with the first and second commands, and that single command processes an entire data table of information and requires only one seek and load step—not three separate steps. Accordingly, if the imaging system 1, according to the present invention, were to produce 500 holes per array, such time saving is significant especially when a plurality of 500 hole arrays are to be manufactured.

Other variations of the third command are as follows:

POabxy=X, Y, O1, O2, W, F, N;

POabxy=X, Y, O1, O2, F, N; or

Plabxy=X, Y, O1, O2, W, F, N.

where, similar to the first and second commands, a and b must be defined or determined as part of a special set of two sets hard-coded axes (i.e. either always the X- and Y-axes or the Z and W);

X is the X-axis stage offset for the product handling system;

Y is the Y-axis stage offset for the product handling system;

O1 is the offset sent to the first axis (i.e. one of the repeat positioners);

O2 is the offset sent simultaneously to the second axis (i.e. the other of the repeat positioners);

W is the time the imaging system will wait in milliseconds;

F is the frequency of the laser; and

N is the number of pulses of the laser to be sent.

The above command structures are also good for other applications including, CNC machining, laser scribing, laser cutting and laser marking or any process that can utilize single line command sequences during production or manufacture of a desired end product.

When triggering preference would need to have its edge trigger on a low to high transition. The signal can either trigger on a high, or low or the transition between those two states. The unique commands, according to the present invention, allow the controller to operate at a much faster speed than is currently available in the prior art.

Suitable lasers, for use with the present invention, will now be briefly discussed. The present invention contemplates use of a variety of different lasers such as a slow flow $CO_2$, $CO_2$ TEA (transverse-electric-discharge), Impact $CO_2$, and Nd:YAG, Nd:YLF, and Nd:YAP and Nd:YVO and Alexandrite lasers. In addition, it is to be appreciated that the imaging system 1, according to the present invention, can utilize all other forms of lasers including gas discharge lasers, solid state flash lamp pumped lasers, solid state diode pumped lasers, ion gas lasers, and RF wave-guided lasers. The above identified lasers are currently available on the market from a variety of different manufacturers.

Figure 18:
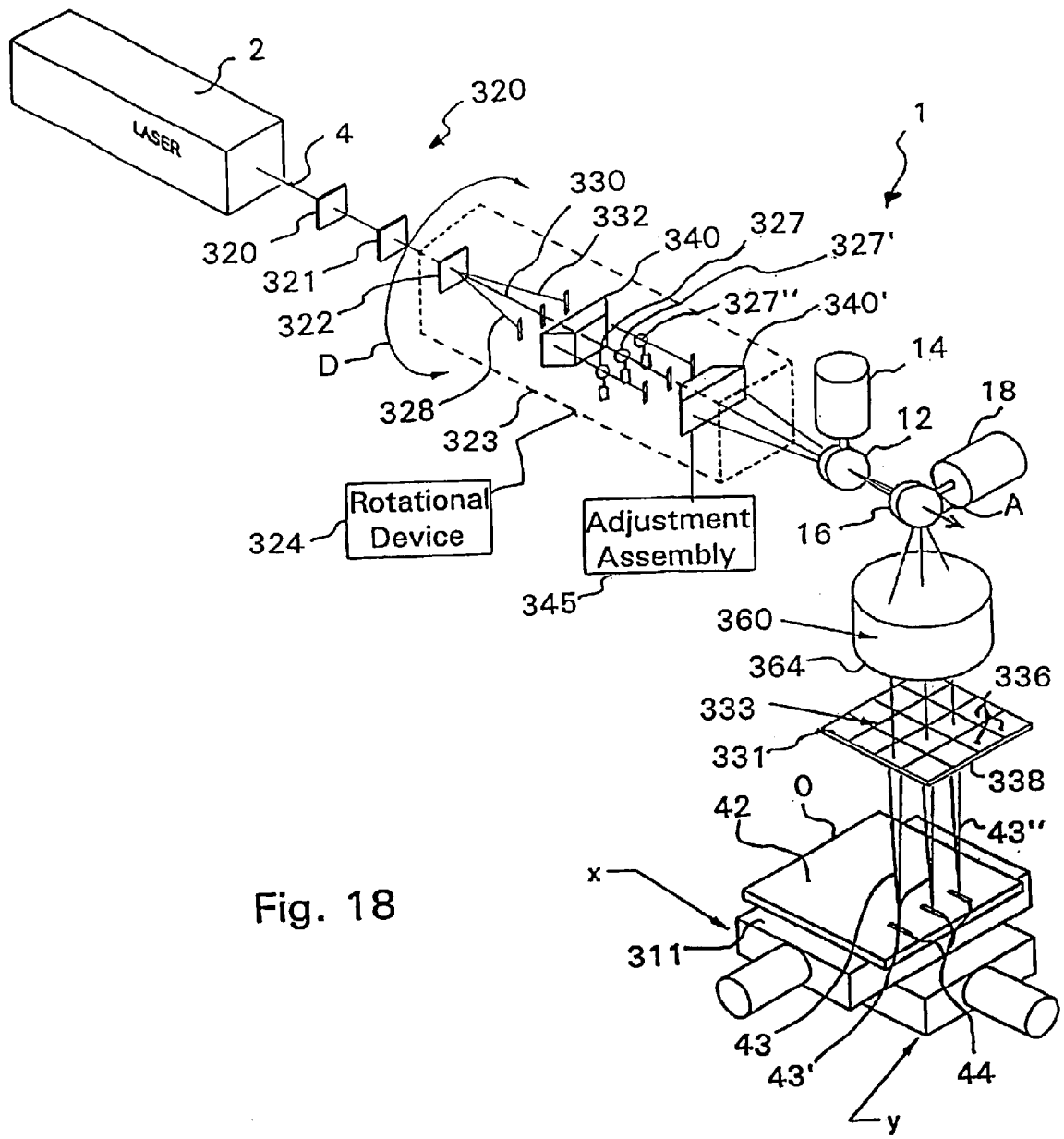
FIG. 18 is a diagrammatic perspective view of a seventh embodiment of the laser imaging system, according to the present invention.
Figure 19:
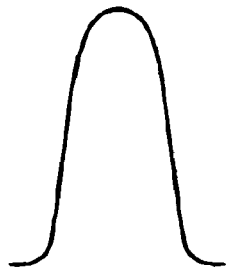
FIG. 19 is a diagrammatic representation showing a wave profile of the emitted initial laser beam.
Figure 20:
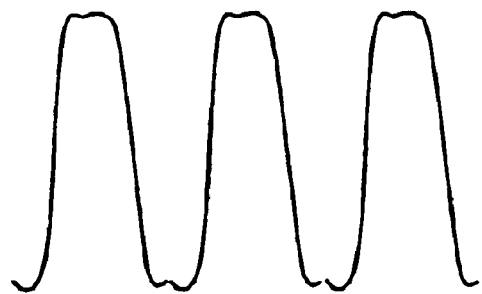
FIG. 20 is a diagrammatic representation showing a wave profile of the three laser beams, at an image plane, following splitting of the initial laser beam.
Figure 21:
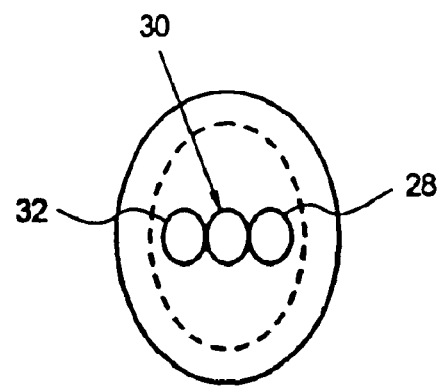
FIG. 21 is a diagrammatic view of a first embodiment of the laser beam delivery system for imagining.

Turning now to FIG. 18, a detailed description concerning a further embodiment of the imaging system 1 apparatus for ablating high-density array of vias or indentations in a surface of an object, according to the present invention, will now be provided. As can be seen in this Figure, a conventional laser 2 is employed for generating and outputting a laser beam 4. It is to be appreciated that the laser 2 can be either excimer or non-excimer laser and further details and operating parameters for the preferred laser, for use with the present invention, will be provided below.

The laser beam 4, generated by the laser 2, is either an ultraviolet, a visible, an infrared, a coherent radiation beam or some other light radiation beam 4 which is supplied along a laser axis 6 to a laser beam splitter/shaper/collimator apparatus, generally designated by reference numerals 320, 321 and 322 where the emitted laser beam 6 is split into a plurality of equally sized and shaped laser beams, preferably three equally sized and shaped laser beams.

As can be seen in this Figure, the laser beam 6 is directed by the laser 4 toward travels through a first computer generated hologram 320 where the light is collimated. The collimated light exits from the front surface of the first computer generated hologram 320 and is supplied to a rear surface of a second computer generated hologram 321. The second computer generated hologram 321 converts or converges the collimated light from a gaussian profile to a line image profile and emits the line image profile beam from a front surface thereof as a substantially flat top beam or a desired wave front beam. The light or laser beam having a line image profile then enters the rear surface of a third computer generated hologram 322 where the light beam is split and emitted, from a front surface of the third computer generated hologram 322, toward a first of a pair of illumination prisms 340, 340', i.e., a converging mechanism, as three equally sized and shaped line image profile laser beams 328, 330, 332. Each one of the illumination prisms 340, 340' has a pair of opposed planar surfaces which both extend perpendicular to the optical axis A of the laser beam delivery system 2 and a pair of inclined surfaces which each form an acute angle with the optical axis A of the laser beam delivery system 2. The two illumination prisms 340, 340' are positioned in an opposed relationship to one another. A shutter 327 (only diagrammatically shown) having a plurality of openable and closable doors is positioned between the two illumination prisms 340, 340' to control the number of separate beams 328, 330 or 332 that are allowed to pass through the shutter or shutters and be directed at the object to be processed 12 after passing through the second illumination prism 340'.

The second illumination prism 340' converges the two outer beams so that the illumination path of each of the outer beams 328, 332, having a line image profile, passes solely through the clear aperture of the mirror 12 of the first repeat positioner 52, while the central beam 330 is not effected by and remains unaltered by the first and second illumination prisms 340, 340'. The second illumination prism 340' is connected to and supported by an adjustment assembly 345, connected to a motor drive (not shown), so that the second illumination prism 340' can be conveyed to and fro along the optical axis A of the laser beam delivery system 2, as necessary, to adjust the degree of overlap of the three equally sized and shaped collimated linear laser beams 328, 330, 332. By adequate control of the second illumination prism 340', the desired convergence of the two outer beams 328, 332 so that they sufficiently overlap the central beam 330 can be achieved so that all three beams 328, 330, 332 pass solely through the clear aperture of mirror 54 of the first repeat positioned 12.

Once all three beams contact and reflect off the first mirror 12, all three beams 328, 330, 332 begin to re-expand to a specific pitch and spacing from one another prior reflecting off the second mirror 16 controlled by the second repeat positioner 18 and striking a collimating or an F-Theta lens 360. The expanded three beams 328, 330 and 332 are each then altered, via the inherent optical characteristics of the collimating or F-Theta lens 360 in a conventional manner. The altered light is then emitted from a front surface 364, of the collimating or F-Theta lens 360, toward a rear surface 330 of a holographic imaging lens 332 and where the three separate beams 328, 330, 332 strike and impinge on three desired areas or portions thereof of the holographic imaging lens 332.

The holographic imaging lens 332 is designed such that as each of the three separate beams 328, 330 and 332 enter by way of the rear surface 330 of one of the holographic imaging segments 336, each of the three separate beams 328, 330 and 332 will be focused, by one of the respective holographic imaging segment 336 of the holographic imaging lens 332, at a desired location or locations along a top surface 42 of the object to be processed O. The top surface 42 of the object to be processed O is located at a desired working distance D, for example, between 5 mm and 1000 mm, and preferably between about 200 to 300 mm from the front surface 338 of the holographic imaging lens 332. The altered light form the each of the three separate beams 328, 330 and 332 is emitted from the front surface 338 of the holographic imaging lens 332 as focused light beams 43, 43', 43".

The focused light beams 43, 43', 43" are directed at a desired location or locations-depending upon the inherent characteristics of the holographic imaging segment 336, along the top or other desired surface 42 of the object to be processed O for drilling, burning or otherwise forming a desired blind via(s), aperture(s), opening(s), indicia, indentation(s) or other surface formation(s) 44 therein of a desired size and a desired depth. It is to be appreciated that the size of the formation(s) 44 is determined and/or defined by the design characteristics of each holographic imaging segment 336 of the holographic imaging lens 332. In addition, the depth of the formation(s) 44 is a direct function of the duration or amount of pulses of the laser 2 emitted at the top surface 42 of the object to be processed. That is, the longer the duration or greater of the number of pulses of the laser 2, the greater the depth of the desired blind via(s), aperture(s), opening(s), indicia, indentation(s) or other surface formation(s) 44 in the object to be precessed O, while the shorter the duration or the smaller the number of pulses from the laser 2, the smaller the depth of the desired blind via(s), aperture(s), opening(s), indicia, indentation(s) or other surface formation(s) 44 in the object to be precessed O. The object to be precessed O is supported on a table 311 which is movable in both the X and Y directions to facilitate formation of the desired blind via(s), aperture(s), opening(s), indicia, indentation(s) or other surface formation(s) 44 in the object to be precessed O.

An important feature of the collimating optics, however, is that the three separate laser beams are collimated to ensure that only collimated light is supplied along the optical axis A from the collimating optics toward the object to be processed 12.

According to this embodiment, the third computer generated hologram 322, the first and second central illumination prisms 340, 340', and the three individual shutters 327 are all supported by and housed within the rotatable module 323. A rotational drive 324 (only diagrammatically shown) is connected to the rotatable module 323 to facilitate rotation of the rotatable module 323 relative to the optical axis A in either rotational direction. Due to this arrangement, as the rotatable module 323 is rotated a desired amount, e.g., 90° counterclockwise or counter clockwise for example, by the rotatable drive 324 with respect to the optical axis A of the laser beam delivery system 2, the orientation of the three beams 328, 330 and 332, which all initially lie in a horizontal plane as can be seen in FIG. 18, changes to an orientation where all three beams 328, 330 and 332 now lie in a vertical plane (not shown).

The two central planar surfaces of the illumination prism 340, which extends perpendicular to the optical axis A of the laser beam delivery system 2, do not redirect the central beam 30 of the three equally sized and shaped laser beams 328, 330, 332, and those two central planar surfaces allow that light to pass directly therethrough without substantially effecting the shape, angle or path of the central beam 330. Each of the pair of inclined surfaces however, alter and/or redirects one of the two collimated outer beams, i.e. one inclined surface redirects collimated beam 328 while the other inclined surface redirects collimated beam 332 so that both of those two beams at least partially converge toward one another and/or overlap the central beam 330 at a desired optical distance from the illumination prism 340'. This redirecting of the two outer beams 328 and 332 over the central beam 330 allows the three equally sized and shaped collimated beams 328, 330, 332 to pass through the clear aperture CAg of a reflective mirror 12 of the first repeat positioner 14, e.g. a first galvanometer or repeat positioner. According to a preferred form of the present invention, the mirror 12 of the first repeat positioner 14 has a clear aperture CAg with a diameter of about 10 mm.

A motorized drive 350 supports the illumination prism 340' and facilitates adjustment of the illumination prism 340, relative to the first mirror 12 of the first repeat positioner 14, so that both of the two outer beams 328, 332 and the central beam 330 will all substantially converge with one another at the first mirror 12 of the first repeat positioner 14. Once all three beams contact and reflect off the first mirror 12, all three beams 328, 330, 332 begin to re-expand to a specific pitch and spacing from one another prior to being reflected by the second mirror 16 of the repeat positioner 18 and reaching and striking a rear surface of an F-Theta lens 360. The F-Theta lens 60 is of a multi-element design which receives the three re-expanding laser beams from the second mirror 16 of the second repeat positioner 18 at the rear surface thereof. The expanded three beams of light enter the F-Theta lens 360 and are each then altered, via the inherent optical characteristics of the F-Theta lens 360 in a conventional manner.

A computer control system is connected drives for both of the first and the second repeat positioners 14, 18 and is also connected to the drive controlling two and fro motion of the illumination optics assembly along the optical axis A. In addition, the laser 4 and the shutter 327 are connected to and controlled by the control system to control opening and closing of the doors and facilitate control of how many and which laser beams 328, 330 and/or 332 are allowed to pass through the shutter 327. Finally, the table 311 is coupled to the computer control system to control the X and Y direction of movement.

The laser beam 6 may be, for example, an IR beam or UV YAG laser having a wavelength of either 355 nm or 266 nm. Alternatively, a $CO_2$ laser or a Q-Switched $CO_2$ laser having a wavelength of either of 9.3 or 9.4 micron may be utilized. The laser beam preferably emits ultraviolet light having a wave length of 354.7 nm (3rd harmonic of Nd:YAG). Preferably the laser beam 6 has a beam diameter of about 2.8 mm±10% and a laser beam mode is TEM00 (Gaussian). The laser M2 is preferably<1.3 while the polarization ratio is preferably>100:1. The pulse duration is preferably 10 ns while the pulse energy of the laser beam 6 is about 450 MicroJoules.

As used in the appended claims, the term "coherent light beam" is intended to cover ultraviolet, visible, infrared, and/or other types of known light radiation beams employed to form a desired formation in a surface of the object to be processed.

It is to be appreciated that the present invention is applicable to both collimated light as well as non-collimated light.

A brief description of a conventional round of ammunition 400, a handgun 402 and an associated firing mechanism will first be provided with reference to FIGS. 22, 23A and 23B.

Turning first to FIGS. 23A and 23B, a conventional round of ammunition 400 generally comprises a shell casing 404 accommodating a desired propellant 406, i.e., a charge of gun powder, therein and a suitable slug or bullet 408 closing the open end of the shell casing 404. The gun powder 406 is first loaded into an interior cavity of the shell casing 404, via an open end of the shell casing, and thereafter the bullet 408 covers the open end of the shell casing 404 and is secured thereto by an interference fit with the opening or crimping method to seal the gun powder within the shell casing 404. The shell casing 404 includes a conventional primer 410 secured to a base of a closed end of the shell casing 404 for igniting the gun powder 406 once the primer 410 is struck by the firing pin 412 upon discharge of the weapon 402. As such round of ammunition is conventional and well known in the art, a further detail discussion concerning the same is not provided.

With reference now to FIG. 22, the basic components of a handgun 402, such as a 9 mm or a 0.45 caliber pistol, will now be described. The handgun 402 generally comprises a main body 414 with a hand grip portion 416 and a trigger assembly 418. The trigger portion 418 includes a number of mechanically linked parts such as a trigger 420, a barrel 422 defining a chamber 424 at one end, a slide 426 having a breach block 428, a firing pin 412 and a hammer 430. In weapons of this type, a locking breech design is often used. This design utilizes a recoil method of operation where the breech block 428 is locked to the barrel 422. Upon firing, the breech block 428 and the barrel 422 together move rearward until the generated gas pressure within the barrel 422 is substantially lowered and the barrel 422 stops but the breech block 424 continues rearward movement with respect to the main body 414 of the firearm.

After firing of a locking breech pistol, the slide 426 is forced rearward, relative to the main body 414, which allows a new round of ammunition 400 to be loaded into the chamber 424, usually from a spring biased magazine 432 located within the handgrip portion 416 of the weapon 402. Once the next round of ammunition 400 has been chambered, i.e., loaded into the chamber 424 of the gun barrel 422, the slide 426 moves forward, relative to the main body 414, and the barrel 422 is locked out of the slide 426 by ribs on the top slotting into recesses in the slide. The next time the trigger 420 is pulled by a user of the firearm, the hammer 430 is released and to drive the firing pin 412 forward through the breech face. The firing pin 412 strikes an exposed surface of the primer 410 and transfers an impression of the identifying indicia, e.g., a code, a bar code, a character set, a symbol, a design or some other identifying mark, to the exposed surface of a primer 410, e.g., the transferred impression is a mirror of the identifying indicia. The striking of the firing pin 412 against the exposed surface of the primer 410 also discharges the primer 410 and this results in a flame F being generated by the primer 410 and emitted into the gun powder contained within the shell casing 404. The gun powder 406 is ignited by the flame F and, as a result of such gun powder ignition, gases are violently generate by the ignited gun powder and the gases rapidly expand within the round of ammunition 400. The expanding gases force the shell casing 404 against the breech face, which forms a part of the slide 426, and simultaneously forces the bullet 408 out of the shell casing 404 and along the length of the barrel 422. The slide 426 thus is forced back, but is connected to the barrel 422 which recoils with it.

The underside of the barrel 422 has a link connected to the non-recoiling frame or main body 414. As the barrel 422 moves rearward, the link rotates and drags the rear end of the barrel 422 down. The ribs and barrel 422 come out of engagement with the slide 426 and the slide 426 continues to recoil on its own, extracts and ejects the empty shell casing 404, in the rearward position thereby permitting the feeding in a new round of ammunition 400 from the magazine 432 into the chamber. The slide 426 then springs forward to reconnect with the barrel 422. It carries the barrel 422 forward and the weapon 402 is thereafter again reloaded and ready to fire. The trigger mechanism 420 includes a disconnect which ensures that to release the hammer 430, the trigger 420 must first be released and then pressed again.

With reference to FIG. 24A, an embodiment for utilizing a firing pin 412 to transfer an impression of the unique identifying indicia to the primer 410 will now be discussed. The firing pin 412 has a head 434 which defines a striking surface 436 which is generally at least slightly spherical in shape. Following manufacture of the firing pin 412, but prior to assembly of the firing pin within a firearm, the striking surface 436 is subjected to a micro-marking procedure in which a unique identifying indicia 438, e.g., a code, a bar code, a character set, a symbol, a design, an alphanumeric set or some other identifying mark, is inscribed by a laser, as described above, in the surface. The laser can either remove material from a base surface 440 so that the unique identifying indicia 438 extends or projects from the base surface 440 or can form the unique identifying indicia 438 as a removed or recessed area in the base surface 440 of the firing pin 412. As a result of this operation, the firing pin 412, once assembled with a remainder of the firearm, will have striking surface 436 carrying the unique identifying indicia 438 which will transfer an impression of the unique identifying indicia 438, of the firing pin 412, to the primer 410 during discharge of the weapon 402.

As can be seen in FIGS. 25A and 25B, when the trigger 420 is squeezed, the hammer 430 drives the firing pin 412 forward forcing the head 434 and striking surface 436 into contact with the primer 410 of the shell casing. The head 434 of the firing pin 412 strikes the primer 410 with a sufficient force such that striking surface 436 contacts the primer 410, thus imprinting and transferring a mirror image impression of the unique identifying indicia 438, formed in the striking surface 436, to the exterior surface of the primer 410 of the shell casing.

In order to form the unique identifying indicia 438 on the head 434 of the firing pin 412, an excimer laser, for example, an LPX2101KrF from Lambda Physik Inc. of Fort Lauderdale, Fla., and a holographic mask technology, as disclosed herein, is used to rapidly produce the desired identifying indicia 438, e.g., a code, a two-dimensional bar code, a character set, a symbol, an alphanumeric feature, a design, a design or some other identifying mark, thereon. The laser system etches the head 434 of the firing pin 412 and removes appropriate material to create the desired unique identifying indicia 438, e.g., a code, a bar code, a character set, a symbol, a design or some other identifying mark. A custom scanning optical system scans the laser beam image in multiple axes of motion, synchronized to the laser firing, to precisely etch the desired characters and/or features over the spherical striking surface 436 of the firing pin 412. The process can produce indicia having widths as small as 0.005 mm and indicia having a height of up to 0.050 mm, with the manufacturing tolerances being on the order of ±0.001 mm.

Using the above described marking technology, the unique identifying indicia 438, e.g., a code, a bar code, a character set, a symbol, a design or some other identifying mark, may be formed in most any material desirable for manufacturing a firing pin 412, for example, stainless steel hardened steel, titanium, composites and ceramics. It is to be appreciated that a computer can be coupled to the laser to automatically control any minor operating adjustments required for various materials. Because of the physics of ultraviolet machining, the stamp material does not suffer from adverse heating effects that commonly occur with machining by $CO_2$ and Md:YAG infrared lasers.

At longer wavelengths, the interaction between the laser and the material is a thermal process which produces charring, or glassification for ceramics, and leaves a poor surface quality. The interaction at ultraviolet wavelengths is a "cold process" which uses energy to break chemical bonds rather than to generate heat in the material. Thus, identifying indicia having excellent accuracy and quality can be easily produced in the desired surface without substantially altering the characteristics of the material or creating chars and/or clumps of material. This above benefits are what make an excimer laser an excellent choice for a variety of micromachining applications.

To evaluate the durability of the identifying indicia 438 formed by the present invention, a test firing pin was manufactured by one of the micromachining process disclosed herein. The test firing pin was then installed on a handgun—as the firing pin is readily accessible and undergoes considerable force it was an obvious vehicle for evaluating the technology's durability during a series of firing experiments.

Testing began by removing the firing pin from a P229 0.30-caliber handgun manufactured by SigArms of Portsmouth, N.H. and replaced with a SigArms certified firing pin modified with the described laser micro-machining process. For the purpose of the experiment, a few raised characters were created in the striking surface of the firing pin as the identifying indicia using the above described techniques.

The weapon was fired 1000 times and all of the ejected shells were collected and arranged in the order in which they were fired. After collecting the first 100 shells discharged by the weapon, the team examined every $10^{th}$ shell and noticed that none of the examined shells exhibited any appreciative degradation in the transferred impression of the unique identifying indicia.

In order to test further the durability of the identifying indicia formed by the present invention, a modified firing pin was clamped to a test apparatus that automatically thrust the firing pin, with sufficient force, into a testing block for 30,000 cycles. After every 1000 cycles of thrusting, the firing pin was inspected for visible signs of wear. The test results showed that the firing pin survived 30,000 cycles and was still able to readily transfer a clear and accurate impression of the identifying indicia from the firing pin to the primer with only a minimal degradation in the quality of the transferred identifying indicia. This minimal degradation in the quality was due to some minor wear of the raised characters formed on the firing pin.

It is to be appreciated that for some applications, the firing pin might not be ideal because it is very easy for a gun owner to access the firing pin 412 and modify the unique identifying indicia 438 or replace the firing pin 412 with a new firing pin which does not have any identifying indicia. According to a further embodiment of the invention discussed below, an internal component of the firearm, for example, a insert 442 that engages with an exterior surface of the shell casing and transfers the carried identifying indicia 438 onto the shell casing upon discharge of the weapon 402 or, alternatively, marking the identifying indicia 438 directly on the interior surface of the breech end or in the chamber of the firearm may prove more suitable.

Turning to FIGS. 26A and 26B, the microstamp or micromarking element comprises an plug or insert 442. The microstamp, micro-marking element insert 442 is provided with either raised, indented or perimeter relieved identifying indicia 438, e.g., a code, a bar code, a character set, a symbol, a design or some other identifying mark, formed on an exposed face 446 of the inset 442. The insert 442 is then received within a radial bore 448 located in the breech end or in the chamber of the firearm. The insert 442 is permanently secured or otherwise affixed to the barrel 422 of the firearm, e.g., by welding or the like, to prevent removal thereof. The insert 442 is sized and located so that a cylindrical surface defined by an exposed surface of the identifying indicia 438 is coincident and substantially flush to assists with forming and defining the cylindrical inner surface 450 of the breech end or the chamber of the barrel 422. It is to be appreciated that the insert 442 may be affixed or secured to the barrel 422 by a variety of ways or techniques that are well known in the art, as these ways or techniques would be readily apparent to those of skill in the art, a further discussion concerning the same is not provided.

FIGS. 27A and 27B show that upon insertion of the round of ammunition 400 and subsequent discharge of the firearm, the primer 410 is stuck by the firing pin 412 which ignites the gun powder 406 and the rapidly expanding gasses G, formed from the gun powder ignition, force the projectile, i.e., the bullet 408, along the length of the barrel 422 and the rapidly expanding gasses G are hot and also force the cartridge casing to expand slightly radially and such radial expansion of the shell casing facilitates a self-embossing transfer of an impression of the identifying indicia, carried by the insert 442, onto the exterior surface of the shell casing 404 or self-flows around, into or onto the microstamp, micro-marking insert 442 or other device that has either raised, indented or perimeter relieved characters that form the marking. The outer surface of the shell casing 404 retains this transferred identifying indicia 438' (see FIG. 27C) and such transferred identifying indicia 438' facilitates law enforcement and/or other government officials with more easily tracing the shell casing 404 to the firearm that discharged the same.

The invention covers the technology and the process involved in forming the microstamping or micromarking element and the application of the technique to forming identifying indicia onto shell casing and or the actual projectile. The microstamping or micro-marking element may take the form of a tooling pin or other machinable insert that will be placed into or onto the existing firearm and be seamlessly incorporated into the firearm, without causing any functional change(s) to the firearm.

The insert 442 can be cylinder in shape (see FIG. 28A), rectangular in shape (see FIG. 28B), hexagonal in shape (see FIG. 28C), square in shape (see FIG. 28D) or have some other desired shape, e.g., be frusto-conical in shape. Further, the insert 442 can be manufactured from stock stainless steel, steel or some other conventional insert. On one face of the insert 442 the code or characters that are required are etched into the surface using laser etching techniques as described herein. After the desired code is placed into or onto the end surface or the surface that will ultimately come into contact with the cartridge casing or projectile. This insert 442 is then mechanically bonded, welded, soldered or has an interference fit with a corresponding slot or cylindrical hole or radial bore formed into the side wall of the breech or barrel area where the cartridge shell casing resides once it is loaded.

The microstamp or micro-marking insert can be added to a variety of other components located within the firearm that offer a chance for a surface of such other component(s) to be brought into contact with a surface of the shell casing with a sufficient force, during loading or unloading of the firearm, to thereby transfer an impression of the identifying indicia 438, e.g., a code, a bar code, a character set, a symbol, a design or some other identifying mark, from the other component(s) to an exterior surface of the shell casing so that a legible or readable impression of the identifying indicia 438' is transferred thereto.

The micro marking or stamping or embossing insert or element can take the form of either a pressed in stamp as shown in FIGS. 1 and 2 or could take the form of a micro marking, stamping or embossing characters placed directly onto or into any component that comes into direct contact with the cartridge or projectile during loading, unloading or discharge of the cartridge or projectile while inside or outside of the breech or barrel 422 or within the magazine holder. For example the micro marking, stamping or embossing characters can be formed directly in or on the breech wall of the weapon inside the chamber.

According to a preferred form of the invention, each firearm will contain a unique identifying indicia 438 which will preferably identify the manufacture of the firearm, the model of the firearm and/or the specific firearm. That is, each firearm will have a total unique identifying indicia 438 so that the transferred impression formed in a shell casing, upon discharge of a round of ammunition, will essentially identify one, and only one, firearm from which the round of ammunition was discharged. Preferably, each make and model manufactured by a specific manufacturer will be sequentially number so that such marking will also provide information concerning the time period during which the firearm was manufactured.

With reference to FIGS. 29A–29F, examples of various types of unique identifying indicia 438 are shown. For example, FIG. 29A shows a raised identifying indicia 438 while FIG. 29B shows an embedded or recessed identifying indicia 438. FIG. 29C shows a combined raised/recessed identifying indicia 438 while FIG. 29D shows a simplified example a recessed bar code identifying indicia 438. FIG. 29E shows a raised two-dimensional bar code identifying indicia 438 while FIG. 29F shows a recessed logo identifying indicia 438.

As described herein above, the present invention is directed to a method and apparatus for reading microstamped identifying indicia 438 formed in or on an exterior surface 452 of a shell casing 404, which may also or alternatively referred to as a cartridge 404, of a round of ammunition 400. As indicated in FIG. 30A, and as described herein above, one or more exterior surfaces 452 of a shell casing or cartridge 404 may be marked with one or more identifying indicia 438 and include a circumferential surface 452*c* that generally bears against the interior surface of the chamber 424, a base surface 452*b* that generally bears against the face of the breach block 426, and a primer surface 452*p*, that is, the exposed surface of the primer 410 that is struck by the firing pin 412.

As described, the identification of the firearm which microstamped an identifying indicia 438 into or onto a shell casing or cartridge 404 is dependent upon the clarity with which the identifying indicia 438 may be read. As also described, an identifying indicia 438 may include, for example, a code, a bar code, a character set, a symbol, a design, an alphanumeric set or some other identifying mark, and may be formed by recessed or raised areas of the material the identifying indicia 438 is stamped into or onto, or of both raised and recessed areas together forming the indicia 438.

Figure 30C:
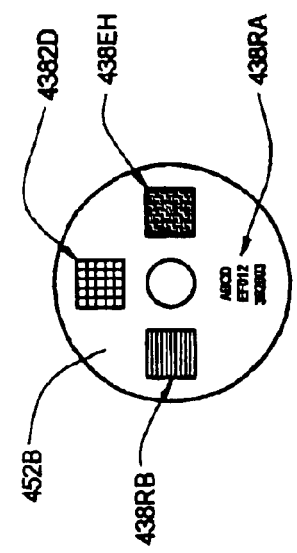
Figure 30B:
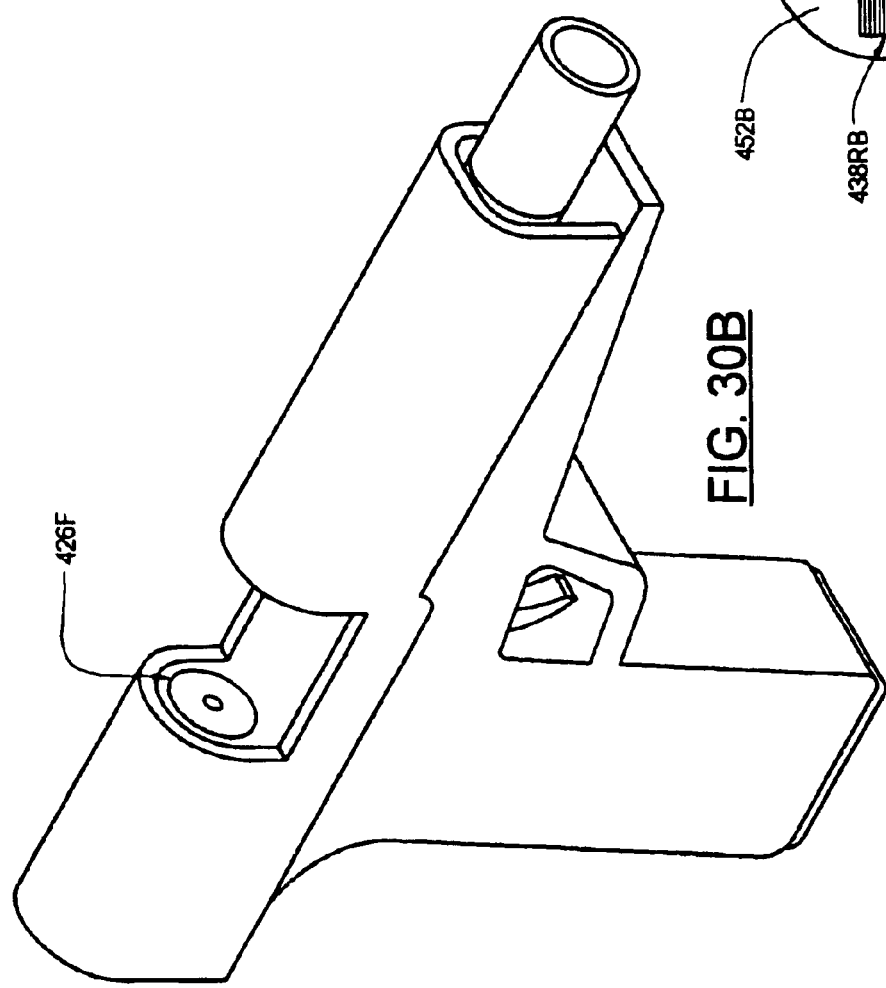
FIG. 30B is an illustration of a firearm and a breach block face thererof.

As described elsewhere herein, one or more indicia 438 may be stamped or formed into or onto a surface 452 of a shell casing or cartridge 404 by any surface of a firearm that comes into sufficient contact with the surface 452. In the example illustrated in FIG. 30B, an indicia 438 may be stamped, embossed or formed by the breach face 426F of a breach block 426 and will appear on the base surface 452*b* of the shell casing or cartridge 404, as illustrated in FIG. 30C. As described, an indicia 438 may be comprised of, for example, of a code, a bar code, a character set, a symbol, a design, an alphanumeric set or of some other identifying mark. Examples of indicia 438 are shown in FIG. 30C and include a raised bar code 438RB, a 2D (two dimensional) bar code 4382D, a raised alphanumeric code 438 RA and a raised encoded hologram code 438 EH. In this regard, is should be noted that an encoded hologram code 438EH may be formed from, for example, alphanumeric data identifying, for example, a firearm maker, a firearm model and a unique identifier for the firearm or at least the breach block 426.

This data may then be transformed or encoded into a hologram, and the reverse transform or image of the hologram etched, machined or otherwise formed in the breach face 426F. Any part or portion of a hologram essentially contains information describing or comprising the entire hologram, so that the entire hologram and the information encoded therein may be reconstructed from any part or portion of the hologram, so that it is very difficult to destroy this form of indicia 438.

It should also be recognized that certain parts of a firearm, and in particular those surfaces that are machined, will typically have a characteristic surface "pattern" that is unique to a given manufacturer or even a given model of firearm and that such a pattern will be embossed, stamped or otherwise formed on a surface 452 of a shell casing or cartridge 404, and may alone serve as an identifier or may be combined with other indicia 438.

An identifying indicia 438, however, is physically and visually small and may be imperfectly formed or may be obscured or deformed to at least some degree. For example, the degree of vertical relief in the indicia 438, that is, the degree to which the surface of the material forming the shell casing or cartridge 404 or primer 410 is raised or lowered with respect to the surrounding surface when the indicia 438 is formed, and thus the contrast and clarity of the indicia 438, may vary, for example, depending upon the hardness or "stiffness" of the material and the force exerted in marking the material. The force exerted in marking the surface 452 may in turn depend upon such factors as the striking force of firing pin 412, the pressure exerted on the circumferential surface 452C by propellant 406, or the pressure exerted by the breach block 426 or by an extractor.

Other factors in forming and reading an indicia 438 may include, for example, dirt, tarnish, corrosion or grease on the surface 452 in which the indicia 438 is formed, attempts to eradicate an indicia 438, wear of the firearm, or distortion in forming the indicia 438. Distortion in an indicia 438, for example, may arise from many causes, such as movement, "setback" or rupture of primer 410, overexpansion of circumferential surface 452*c* or longitudinal movement of shell casing or cartridge 404 due, for example, to a worn or overlarge chamber 424 or a mismatch between the firearm and round of ammunition 400, and so on. These and other factors may also operate to obscure or distort an indicia 438 after it is formed into a shell casing or cartridge 404, such as during a period after the round of ammunition 400 is fired and before the shell casing or cartridge 404 is found and taken as evidence. Such factors may include, for example, physical damage to the shell casing or cartridge 404 or tarnish or corrosion of the surface 452.

The reliable and accurate "reading" of an indicia 438 and thus the identification of a firearm that formed the indicia in a surface 452 of a shell casing or cartridge 404 is thereby dependent upon an ability and capability to "read" and capture an indicia 438 image from a surface 452 of a shell casing or cartridge 404, that is, the clarity with which the indicia 438 can be identified.

According to the present invention, and as illustrated in FIG. 30, a shell casing or cartridge 404 may have one or more identifying indicia 438 on one or more exterior surfaces 452 of the shell casing or cartridge 404 wherein the possible surfaces 452 include a circumferential surface 452*c* that generally bears against the interior surface of the chamber 424, a base surface 452*b* that generally bears against the face of the breach block 426, and a primer surface 452*p*, that is, the exposed surface of the primer 410 that is struck by the firing pin 412. As also illustrated in FIG.

30, wherein exemplary indicia 438 are illustrated as stamped on a base surface 452b of a shell casing or cartridge 404, an identifying indicia 438 may include, for example, a code, a two or three dimensional bar code, an encoded hologram, a character set, a symbol, a design, an alphanumeric set or some other identifying mark. The indicia 438 may be formed by recessed or raised areas of the material the identifying indicia 438 is stamped into or onto, or of both raised and recessed areas together forming the indicia 438.

As illustrated in FIG. 31, an indicia imaging apparatus 454 for capturing an indicia 438 image from a surface 452 of a shell casing or cartridge 404, such as a base surface 452b, includes an optical magnifying mechanism 456 viewing a surface 452 bearing an indicia 438 along a viewing axis 458 that is generally perpendicular to the surface 452 bearing the indicia 438. In this regard, it will be recognized that the method and apparatus of the present invention is equally usable for identifying an indicia 438 stamped or otherwise formed in other elements of a round of ammunition 400, such as the bullet 408.

The indicia imaging apparatus 454 further includes a viewing mounting device 460 for holding an item to be viewed, such as a shell casing or cartridge 404 or a bullet 408, with the exterior surface 452 bearing the indicia 438 or a region of the surface 452 suspected of bearing an indicia, along a plane perpendicular to the viewing axis 458, wherein the viewing axis 458 is illustrated in FIG. 31 as extending along the perpendicular or z-axis and the plane in which the surface 452 is located extends along the horizontal x- and y-axes. The indicia imaging apparatus 454 may further include a positioning mechanism 462 whereby the viewing mounting device 460 may be positionable along the z-axis, that is, the viewing axis 458, for focusing purposes, or focusing may be accomplished in the optical magnifying mechanism 456, or by a combination thereof. The positioning mechanism 462 will typically includes mechanisms for positioning the viewing mounting device 460 in the x- and y-planes so that an indicia 438 or region of a surface 452 suspected of bearing an indicia may be generally centered along the viewing axis 458, and so that the surface 452 may be moved or scanned in the x- and y-planes with respect to the viewing axis 458.

A viewing mounting device 460 is illustrated in FIG. 31 as supporting and holding a shell casing or cartridge 404 in the vertical position, so that base surface 452b or primer surface 452b may be viewed by optical magnifying mechanism 456. It will be recognized and understood, however, that a viewing mounting device 460 may be readily designed and adapted to hold a cylindrical item, such as a shell casing or cartridge 404 or bullet 408, in the horizontal position so that the circumferential surface 452c may be viewed by optical magnifying mechanism 456. In this regard, it will be further recognized and understood that a viewing mounting device 460 may be designed and constructed to allow rotation of the shell casing or cartridge 404, bullet 408 or other item about any or all of the x-, y- and z-axes, thereby allowing all exterior surfaces 452 of the item to be viewed and allowing the item to be oriented around any selected axis. The design of viewing mounting devices 460 capable of lateral motion in any plane or along any axis and capable of rotation about any axis are well known to those of skill in the arts, and therefore will not be discussed in further detail herein.

Figure 32:
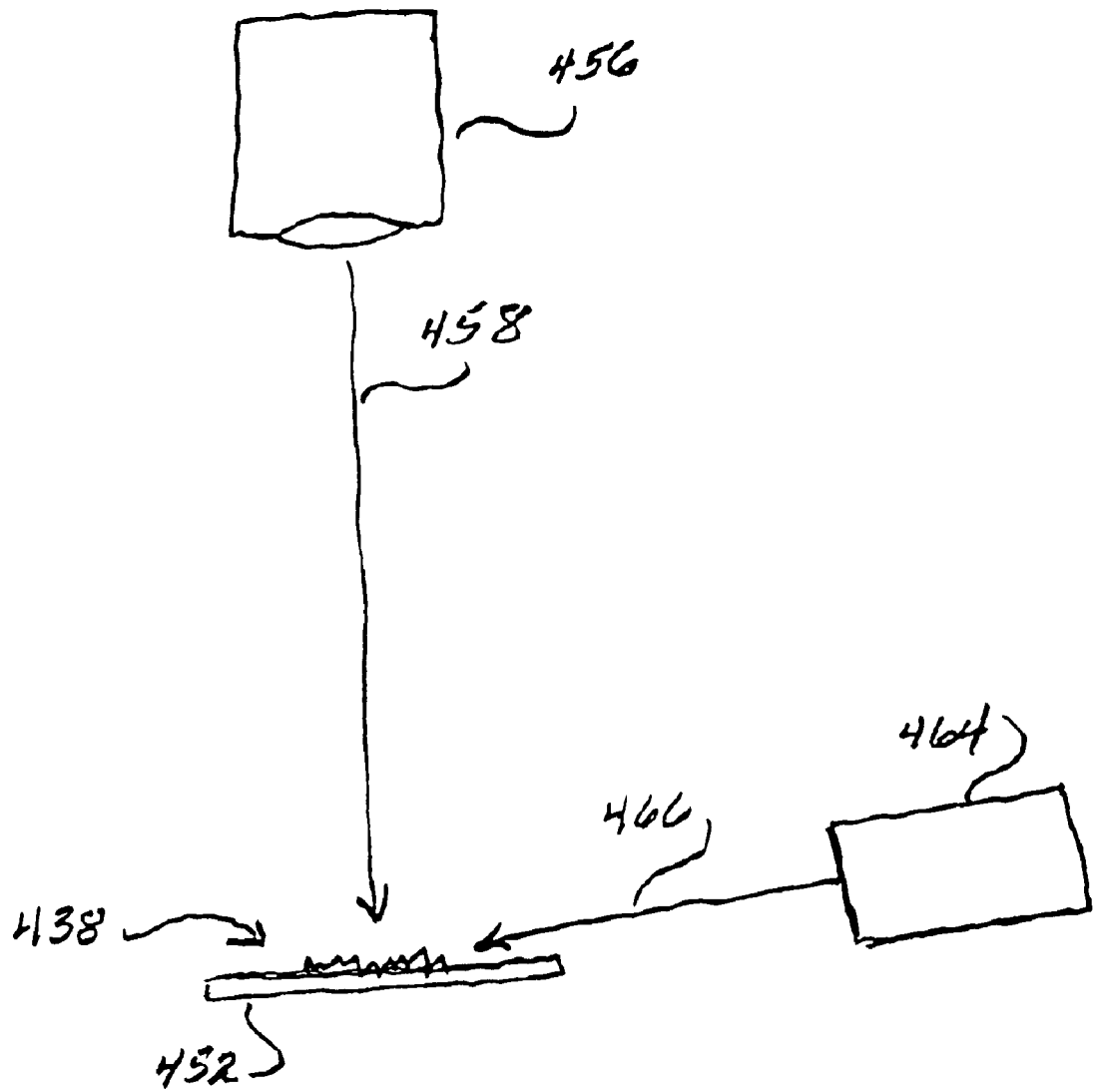
FIG. 32 is an illustration of a viewing axis and illumination plane in an imaging and image capture apparatus; and, FIG. 33 is a diagram of an imaging and image capture apparatus.

As indicated in FIG. 32, an indicia imaging apparatus 454 of the present invention also includes an illuminator 464 directing illumination onto the exterior surface 438 being viewed by optical magnifying mechanism 456. According to the present invention, illuminator 464 directs illumination onto the exterior surface 438 being viewed along an illumination plane 466, or axis, that is aligned substantially normal to the viewing axis 458 is thereby approximately parallel to the x/y plane. The illumination plane 458 is thereby approximately parallel to and is incident upon the exterior surface 452 being viewed along viewing axis 458, at least in a region wherein the indicia 438 being examined is location or where an indicia 438 is suspected of being present. The illuminator 464 thereby illuminates the indicia or region suspected of containing an indicia in a manner to maximize the highlighted and shadowed areas of the indicia, that is, the raised or lower areas of the indicia 438, or both, and to thereby provide the maximum image contrast and clarity.

In a presently preferred embodiment of an indicia imaging apparatus 454, illuminator 464 and optical magnifying mechanism 456 include and comprised an optimized holographic imaging system integrated into a mono-chromatic and multi-chromatic illuminator to provide illumination from various angles onto the working areas of the optical magnifying mechanism 456 and surface 452 and to provide a non-shadowing intensity variable light.

It will also be recognized that an illuminator 464 may, in other embodiment, include facilities for colored or polarized light, while the optical magnifying mechanism 456 may include appropriate filters, and various lenses, masks and so on to shape the illumination plane 466 as desired or necessary. Also, it will be understood that imaging systems of the present invention may utilize illumination other than visible light, such as ultraviolet or infrared radiation, and may incorporate the appropriate filters, lenses and imaging apparatus as necessary and may incorporate a wide range of illumination sources, such as a laser diode array and/or light emitting diode array. The illumination mechanism may also include various positioning and rotational mechanisms to control the angle of incidence of illumination plane 458 with the surface 452 being viewed and, in at least some embodiments, the angle of rotation of the illumination plane 466 axis around viewing axis 458.

Figure 33:
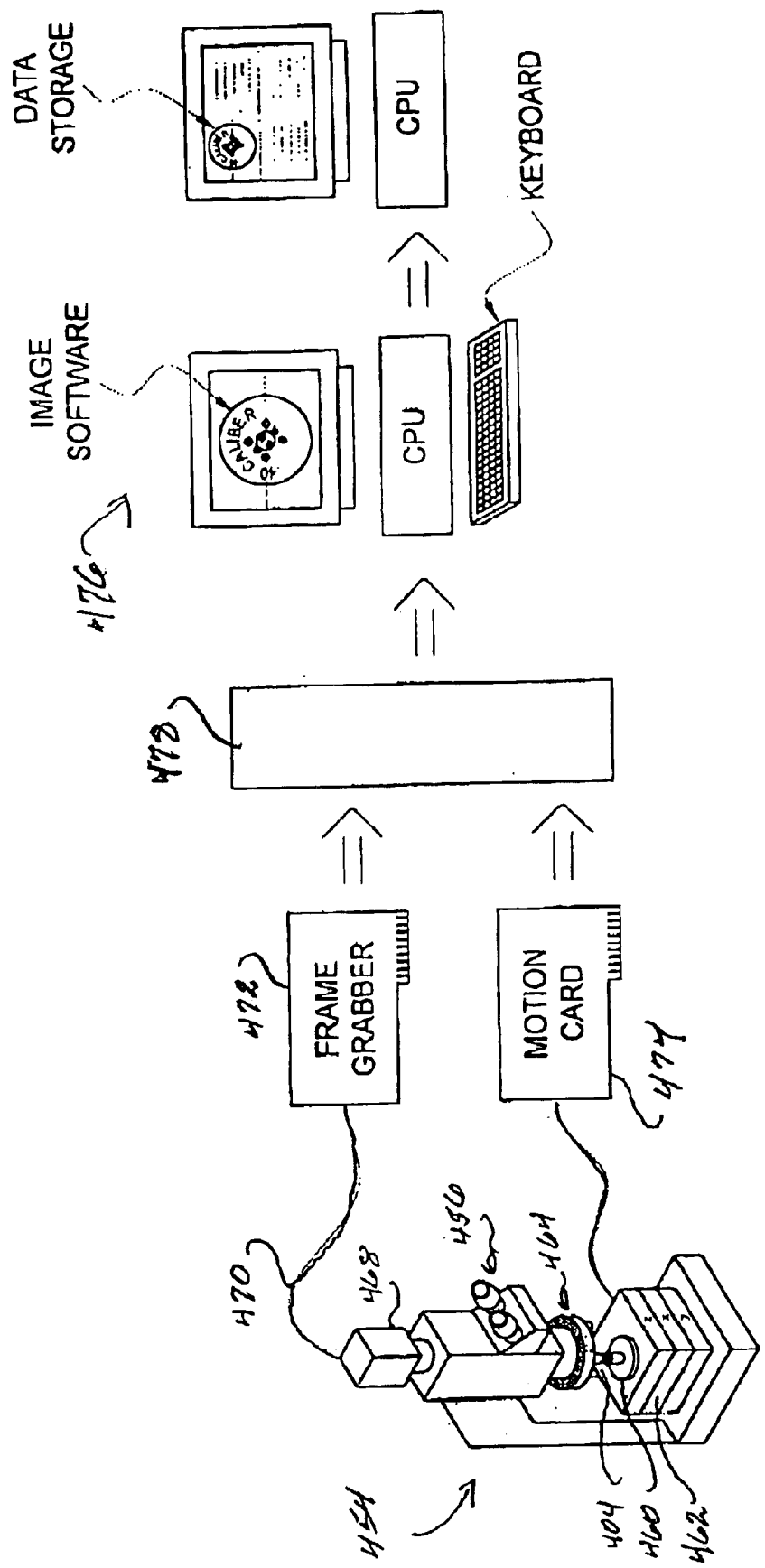

As illustrated in FIGS. 31 and 33, an indicia imaging apparatus 454 will typically further include an image capture device 468, such as a CCD (Charge Coupled Device) camera, for capturing and providing digital surface images 470 of a selected area of a surface 452, including any identifying indicia 438 appearing therein. In this regard, it will be recognized and understood that optical magnifying mechanism 456 will be capable of providing optical images at a range of selectable magnifications, resolutions and image areas. Image capture device 468 captures digitally encoded images from the optical images provided by optical magnifying mechanism 456, and can thereby capture digitally encoded images of a range of selectable magnifications, resolutions and image areas.

Lastly in this regard, the indicia imaging apparatus 454 will typically include a frame grabber 472 or equivalent for capturing surface images 470, and a motion card 474, controlled by a user or by other elements of the apparatus, for controlling viewing mounting device 460. Motion card 474 may, for example, include an automatic focusing mechanism whereby a present surface image 470 is analyzed to determine the sharpness and focus of the image, and the analysis results employed, through motion card 474, to control the focus of the optical elements of optical magnifying mechanism 456. Such autofocus methods and mechanisms are, however, well known in the art and need not be discussed further herein.

As shown, the surface images 470 may be communicated to an image processing system 476 through a data link 478 comprised, for example, of a network, computer, database or server, or other system. Then image processing system 476 may be comprised, for example, of an image processing and analysis system 480 for performing such operations as image enhancement, image analysis and recognition, and so on, and an image data storage system 482 for storing the surface 452 images, including any indicia 438 found thereon. Image data storage system 482 may also store, for example, information translating and identifying various assigned identifying indicia 438, and may include mechanisms for identifying firearms from the imaged indicia 438.

For example, the image processing system 476 may include a specialized computer algorithm for generating one or more of a reconstruction, a decipherment or an optical recognition at least one of a make, a model, a serial number, a unique ballistic identifier or a ballistic identifier tag of a specific firearm used to fire the cartridge or bullet being analyzed by viewing one or more indicia on a surface of the cartridge or bullet, wherein the indicia may be comprised of an encrypted code, an encoded hologram, encoded alphanumeric code, a barcode or any other form of indicia on a surface of the cartridge or a bullet, and to analyze the captured image.

In summary, therefore, the present invention provides an apparatus and method for identifying firearms that includes the steps of:

(A) illuminating a base of the fired cartridge from a firearm found at a crime scene using axially homogenized light from various illumination angles using a holographic imaging system integrated into either a mono-chromatic or multi-chromatic light;

(B) obtaining, through an imaging microscope, an image of the encoded hologram or encoded alphanumeric code or barcodes or indicia that form the breech face impressions on a primer of the cartridge or bullet; and, (C) utilizing specialized analysis software to read the encoded codes and provide the serial number or tracking number unique to the firearm that fired the bullet or cartridge.

The method of the present invention thereby does not require a comparison of cartridges, but simply takes an image of the code embossed on the cartridge or bullet that is formed upon the firing of the firearm and the subsequent ejection of the cartridge or bullet from that specific firearm.

Since certain changes may be made in the above described method and system, without departing from the spirit and scope of the invention herein involved, it is intended that all of the subject matter of the above description or shown in the accompanying drawings shall be interpreted merely as examples illustrating the inventive concept herein and shall not be construed as limiting the invention.

Wherefore, I claim:

1. Imaging and image capture apparatus for a cartridge and a bullet fired from a firearm, comprising:
   a mounting device for holding one of a cartridge and a bullet with a surface thereof at any axis within a field of view and focus range of a microscope;
   the microscope having a viewing axis and mounted with the viewing axis substantially perpendicular to the surface of the one of a cartridge and bullet for obtaining images of an exterior surface of one of the cartridge and bullet; and,
   an illuminator having a light source providing at least one of mono-chromatic and multi-chromatic light and including an integrated holographic imaging system for projecting the light generated by the illuminator along an illumination plane at a selectable angle to an area of a surface of the one of a cartridge and bullet within a field of view of a microscope imaging objective in a homogenous light field free shadowing effects;
   wherein images of indicia on an exterior surface of one of a cartridge and bullet are captured and viewed.

2. The imaging and image capture apparatus of claim 1, wherein the microscope has a variable magnification for adjusting a field of view of the microscope to capture variously sized indicia that is one of embossed and marked on a surface of one of a cartridge and a bullet.

3. The imaging and image capture apparatus of claim 2, further comprising an automatic focusing mechanism for automatically adjusting the focus of an image of an exterior surface of one of a cartridge and bullet located along a viewing axis of the microscope.

4. The apparatus as claimed in claim 1, wherein the light source is one of a laser diode array and a light emitting diode array.

5. The imaging and image capturing apparatus of claim 1, further comprising:
   a laser scanner and laser imaging system associated with the microscope for generating the images of an exterior surface of the one of a cartridge and bullet;
   a positioning mechanism with at least two axes of motorized automatic adjustment within an axis of the laser scanner and laser imaging system; wherein
   the laser scanner and imaging system map a three dimensional surface topography of an entire one of a cartridge and bullet and generate at least one of a displayable high resolution graphical map and a computer image file.

6. The imaging and image capturing apparatus of claim 1, wherein the light source is an infrared radiation source and the apparatus further includes a laser scanning and imaging system for capturing infrared illuminated images of an exterior surface of one of a cartridge and a bullet.

7. Imaging and image capture apparatus for a cartridge and a bullet fired from a firearm, comprising:
   a mounting device for holding one of a cartridge and a bullet with a surface thereof at any axis within a field of view and focus range of a microscope;
   the microscope having a viewing axis and mounted with the viewing axis substantially perpendicular to the surface of the one of a cartridge and bullet for obtaining images of an exterior surface of one of the cartridge and bullet; and,
   an illuminator having a light source providing at least one of mono-chromatic and multi-chromatic light and including an integrated holographic imaging system for projecting the light generated by the illuminator along an illumination plane at a selectable angle to an area of a surface of the one of a cartridge and bullet within a field of view of a microscope imaging objective in a homogenous light field free shadowing effects;
   an automatic focusing mechanism for automatically adjusting the focus of an image of an exterior surface of one of a cartridge and bullet located along a viewing axis of the microscope;
   wherein images of indicia on an exterior surface of one of a cartridge and bullet are captured and viewed; and
   whereby a specialized computer algorithm is used to at least one of a reconstruction, a decipherment and an optical recognition at least one of a make, a model, a serial number, a unique ballistic identifier or a ballistic identifier tag of a specific firearm used to fire one of the cartridge and the bullet being analyzed, by viewing at least one of an encrypted code, an encoded hologram, encoded alphanumeric code, a barcode and an indicia on a surface of the one of a cartridge and a bullet and to analyze the captured image.

* * * * *